(12) United States Patent
Zeng et al.

(10) Patent No.: US 8,354,711 B2
(45) Date of Patent: *Jan. 15, 2013

(54) POWER MOSFET AND ITS EDGE TERMINATION

(75) Inventors: Jun Zeng, Torrance, CA (US);
Mohamed N. Darwish, Campbell, CA (US); Richard A Blanchard, Los Altos, CA (US)

(73) Assignee: MaxPower Semiconductor, Inc., Santa Clara, CA (US)

( * ) Notice: Subject to any disclaimer, the term of this patent is extended or adjusted under 35 U.S.C. 154(b) by 104 days.

This patent is subject to a terminal disclaimer.

(21) Appl. No.: 12/806,203

(22) Filed: Jan. 11, 2010

(65) Prior Publication Data
US 2012/0043602 A1 Feb. 23, 2012

(51) Int. Cl.
*H01L 29/76* (2006.01)
(52) U.S. Cl. ........ 257/330; 257/341; 257/342; 257/346; 257/E29.148

(58) Field of Classification Search .................. 257/330, 257/341, 342, 346
See application file for complete search history.

(56) References Cited

U.S. PATENT DOCUMENTS
8,076,719 B2 * 12/2011 Zeng et al. .................... 257/330

* cited by examiner

*Primary Examiner* — Wai Sing Louie
(74) *Attorney, Agent, or Firm* — Robert O. Groover, III; Gwendolyn S. S. Groover; Groover & Associates, PLLC

(57) ABSTRACT

Improved MOSFET structures and processes, where multiple polysilicon embedded regions are introduced into the n+ source contact area. A top poly Field Plate is used to shield the electric field from penetrating into the channel, so that a very short channel can be used without jeopardizing the device drain-source leakage current. A bottom poly Field Plate is used to modulate the electric field distribution in the drift region such that a more uniform field distribution can be obtained.

20 Claims, 36 Drawing Sheets

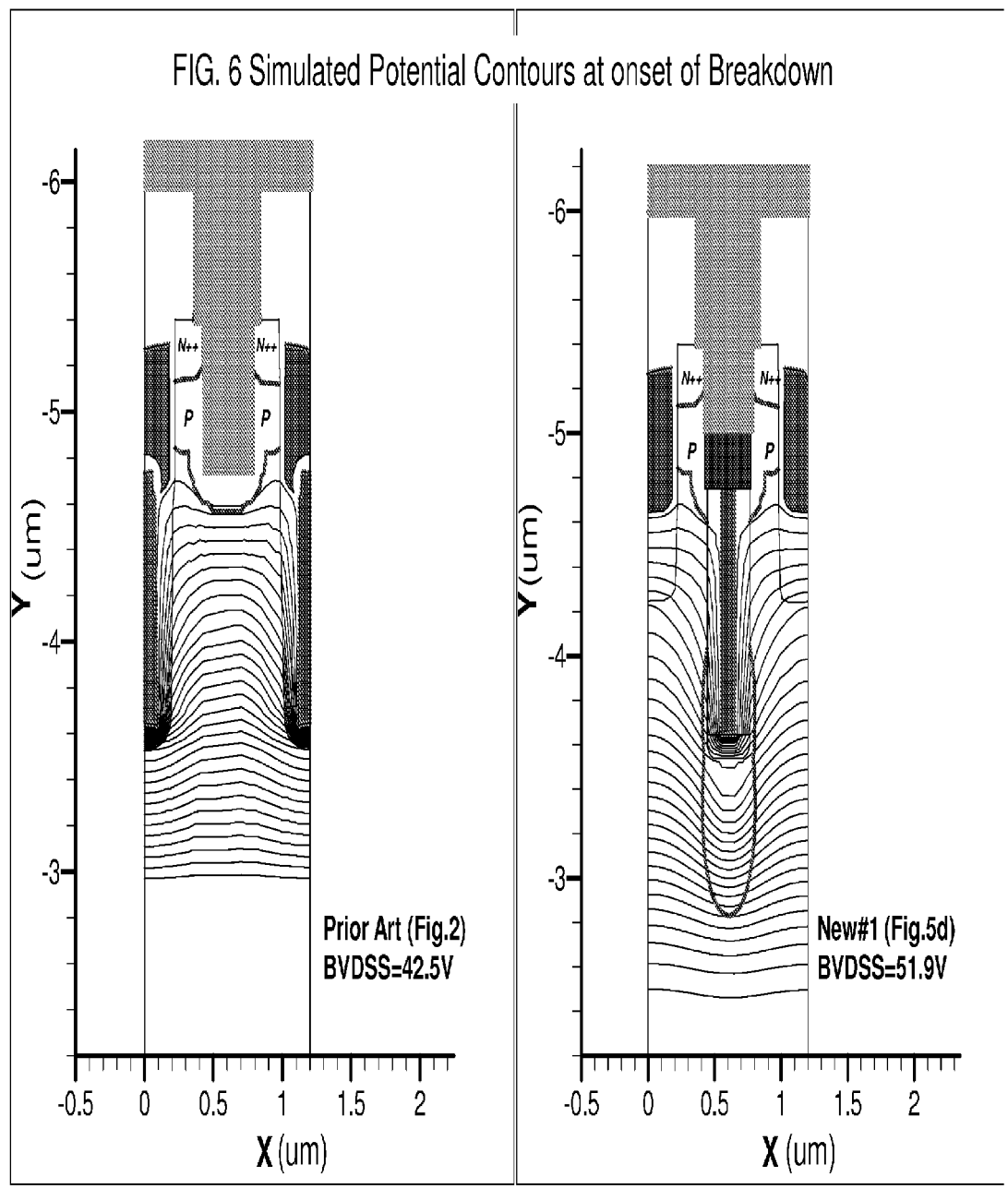

Hard Mask Define

Trench Etch
Sac Oxidation
P-type dopant (e.g., B) Implant
(single or multiple implants)

Field Oxide Grown
(50nm – 500nm)

PolySi Fill and Etch Back
N-type dopant (e.g. P) Implant
Anneal

Trench Mask

Trench Etch
Photo Resist Removal

Trench Oxide Fill
Planarization

Oxide Etch Back

Oxide Etch Back

Gate Oxide Grown

Gate PolySi Fill

Gate PolySi Etch Back

Final Device Structure

1st Trench Etch

2nd Trench Photo and Etch
P-type Dopant Implant

Photo and Hard Mask Removal
Field Oxide Grown
(50nm – 500nm)

PolySi Fill and Etch Back

Trench Oxide Fill
Planarization

Oxide Etch Back
N-type Dopant Implant
Anneal

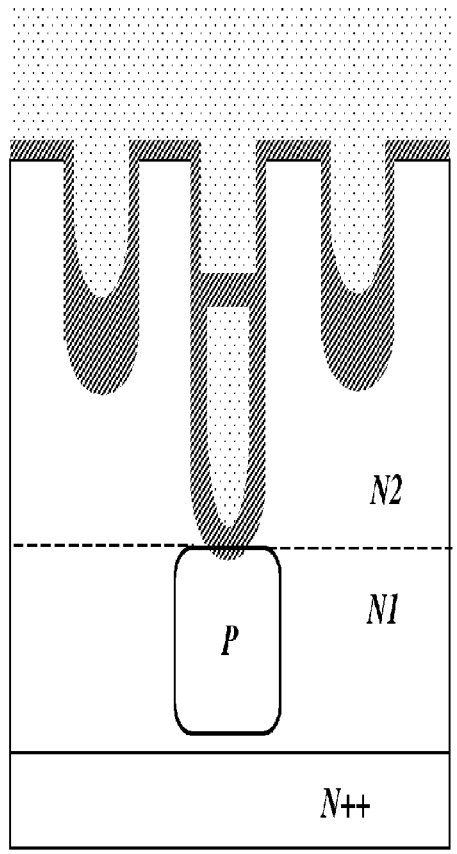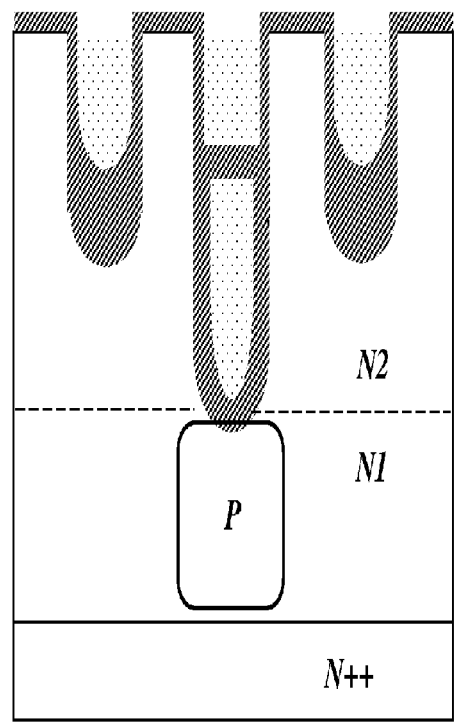
FIG. 25
Gate Oxide Grown
Gate PolySi Fill
FIG. 26
Gate PolySi Etch Back

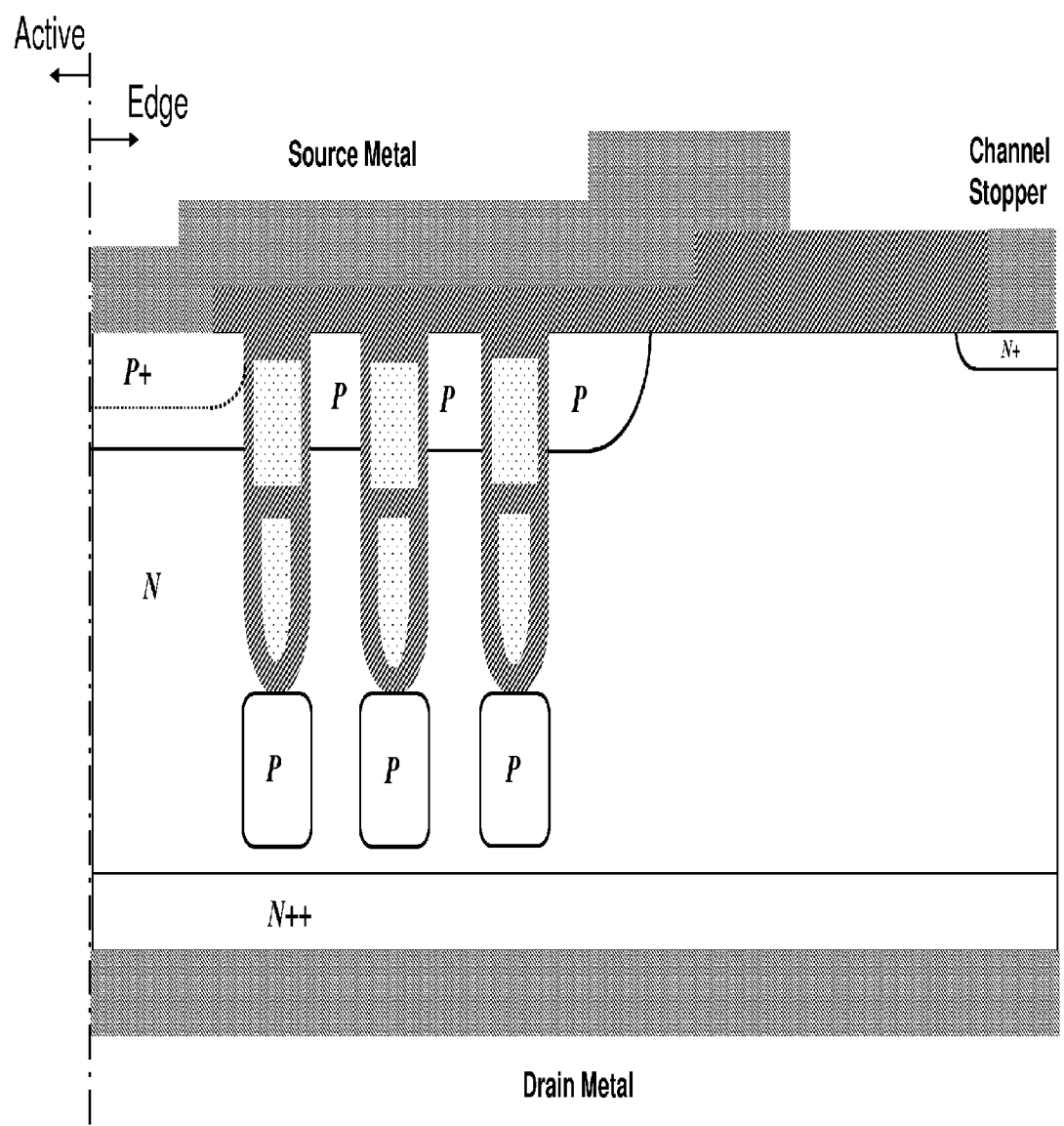
FIG. 32 Edge Termination Structure

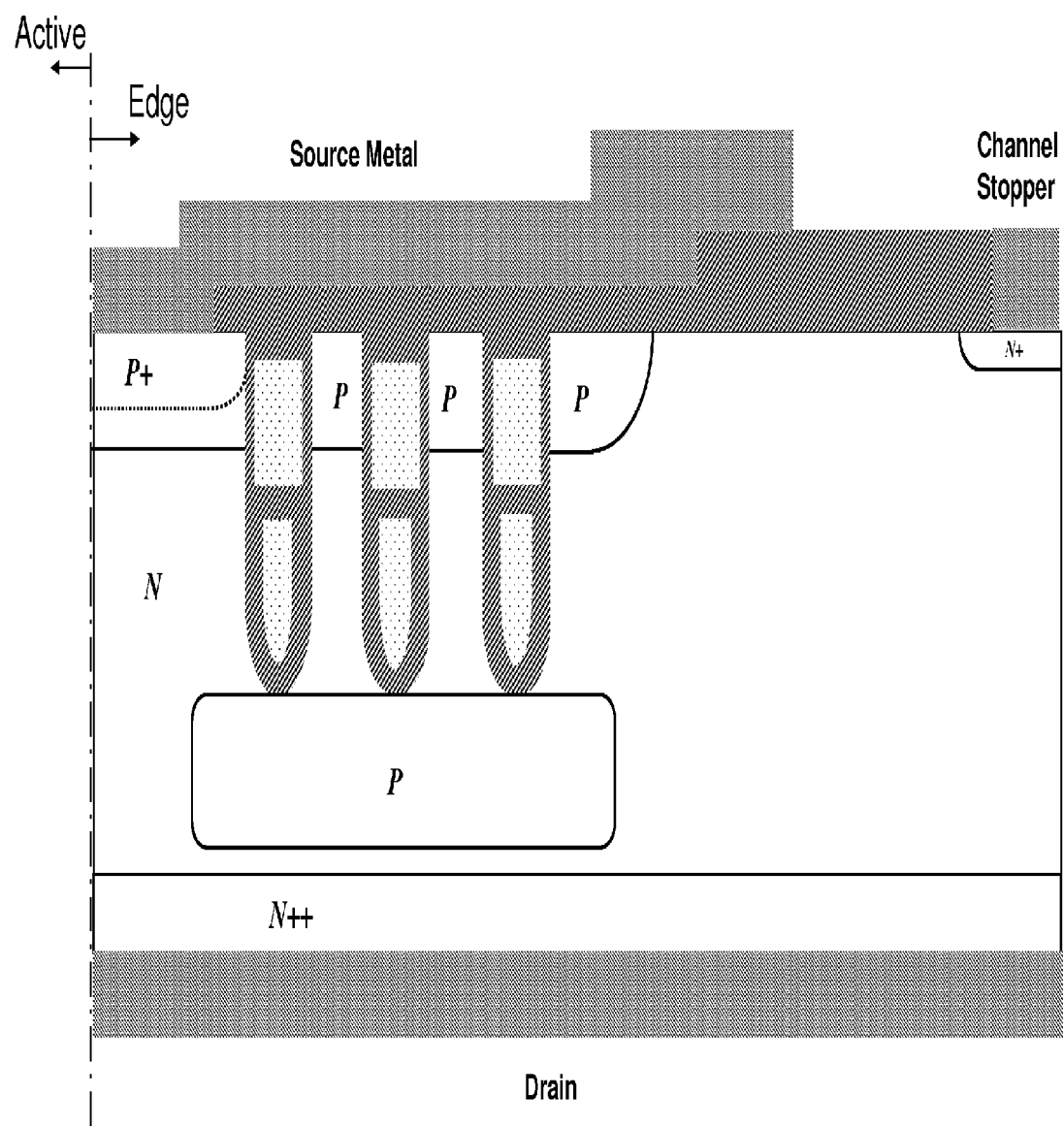
FIG. 33 Edge Termination Structure

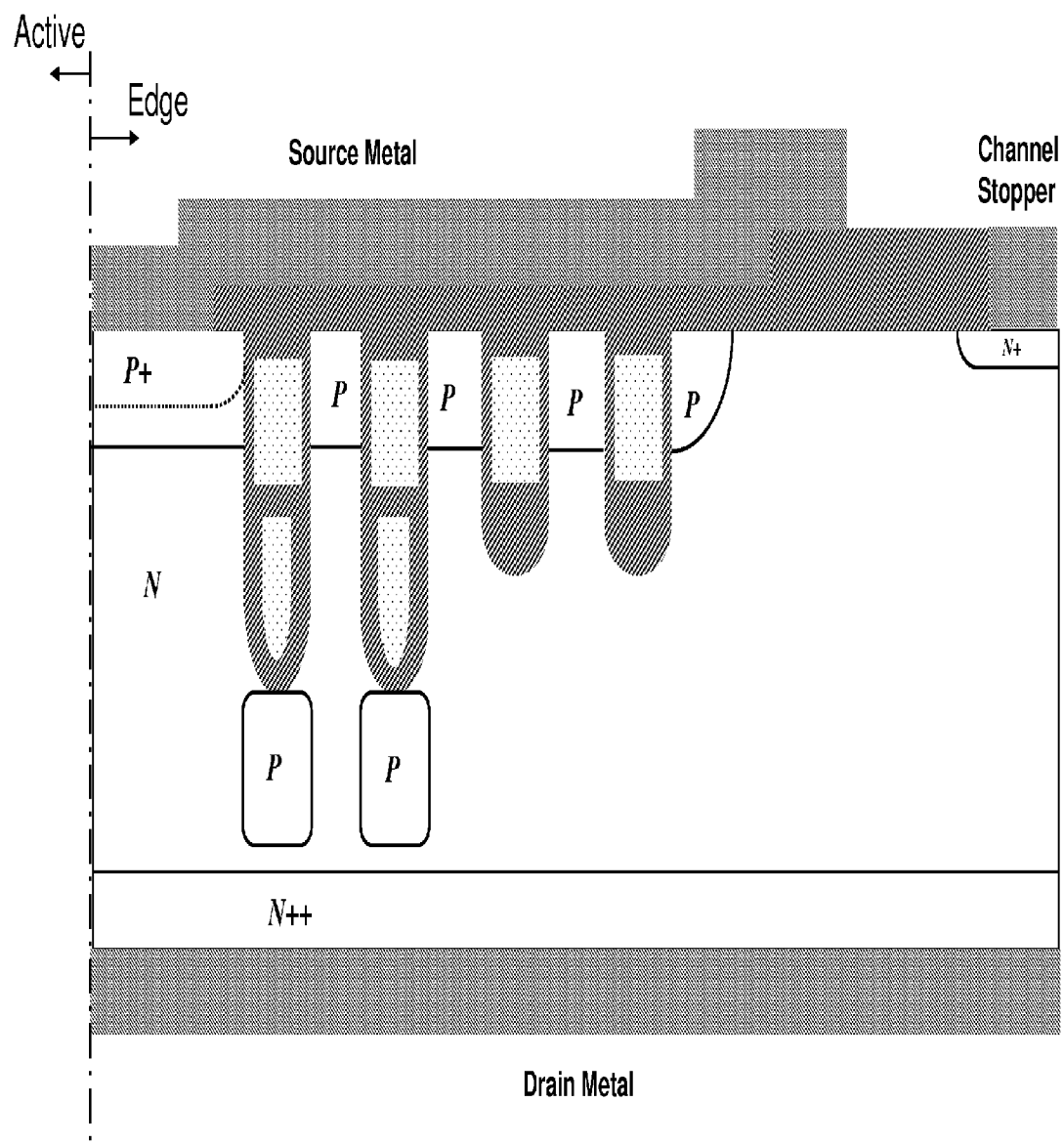
FIG. 34 Edge Termination Structure

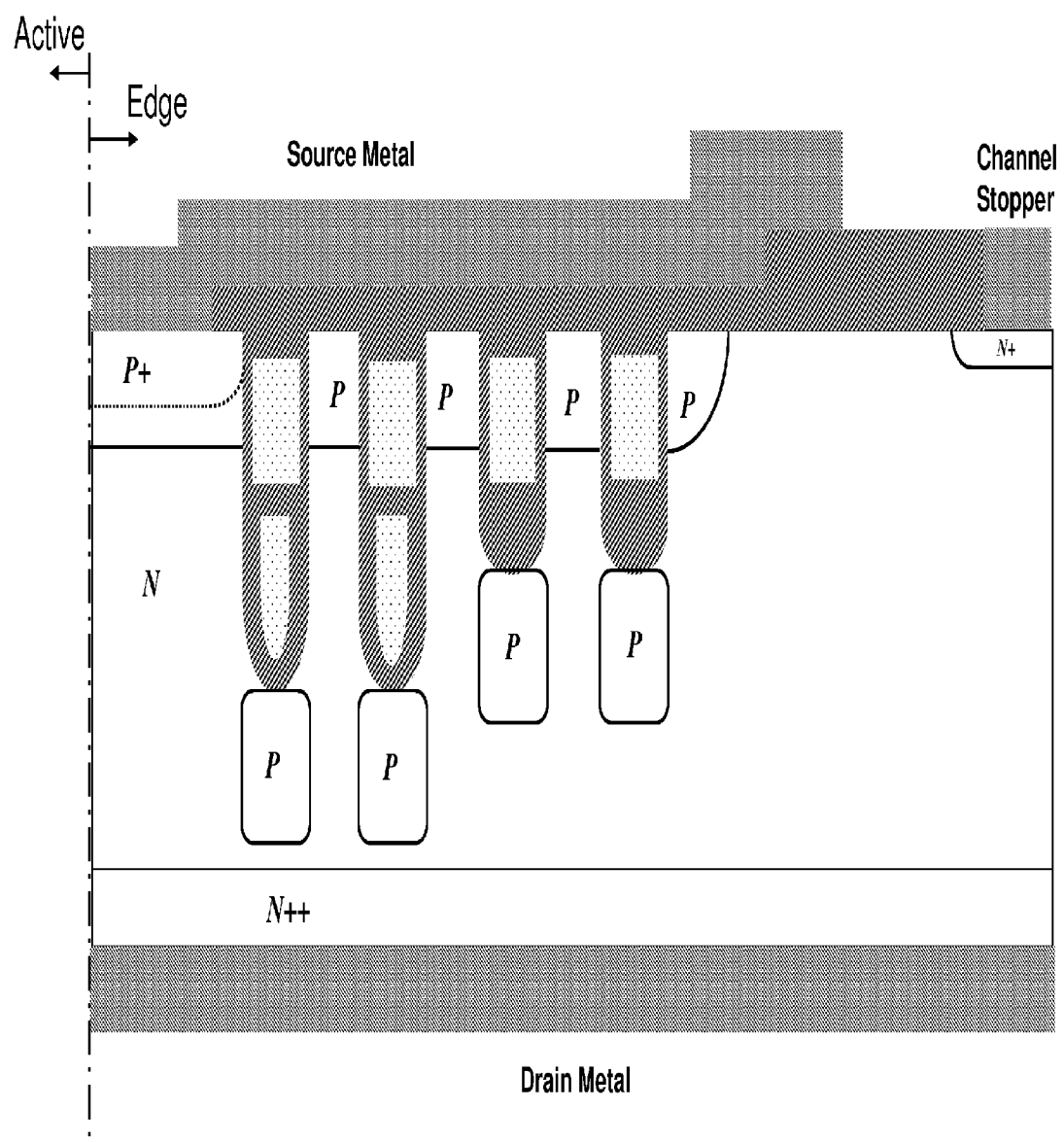
FIG. 35 Edge Termination Structure

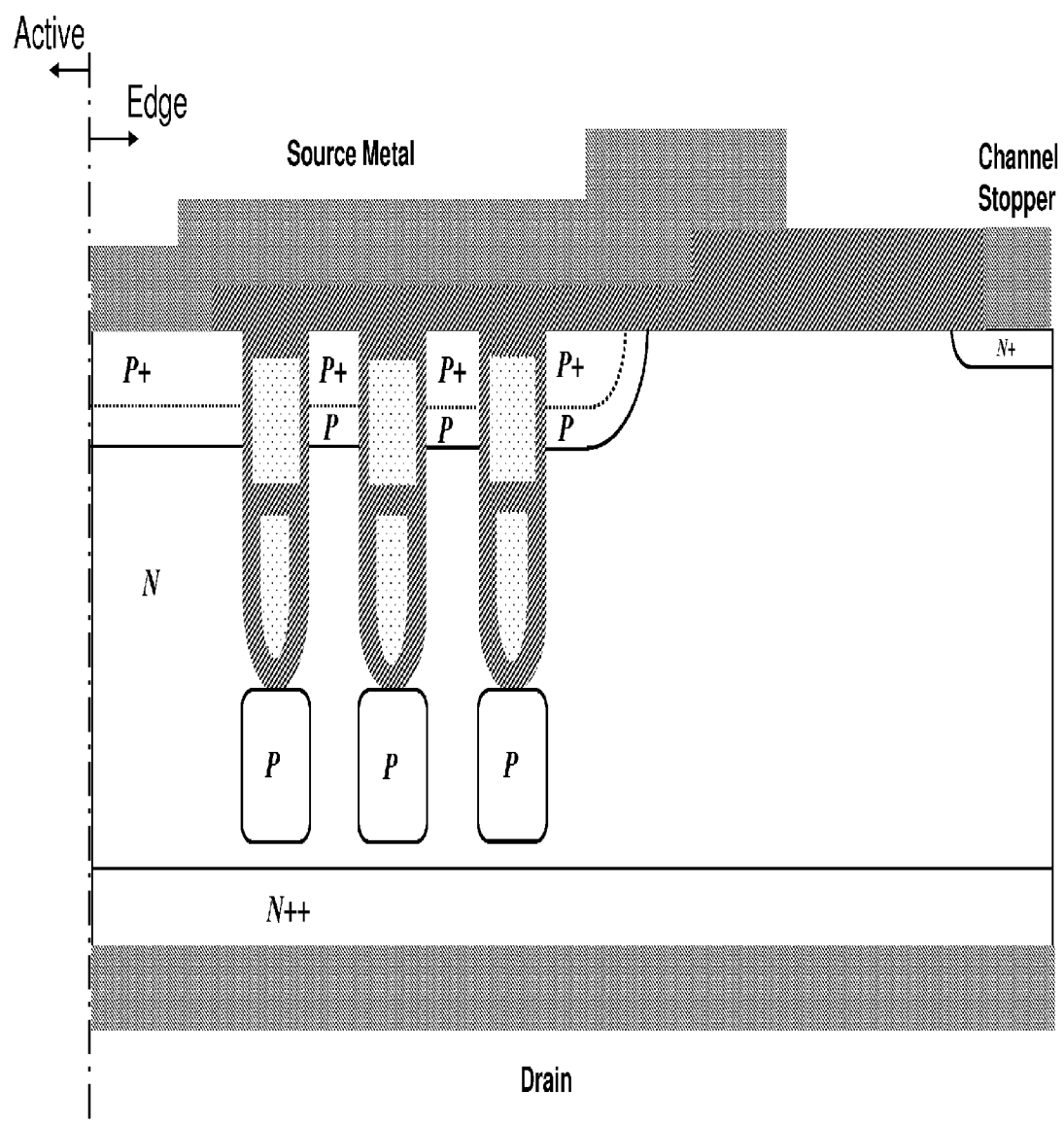
FIG. 36 Edge Termination Structure

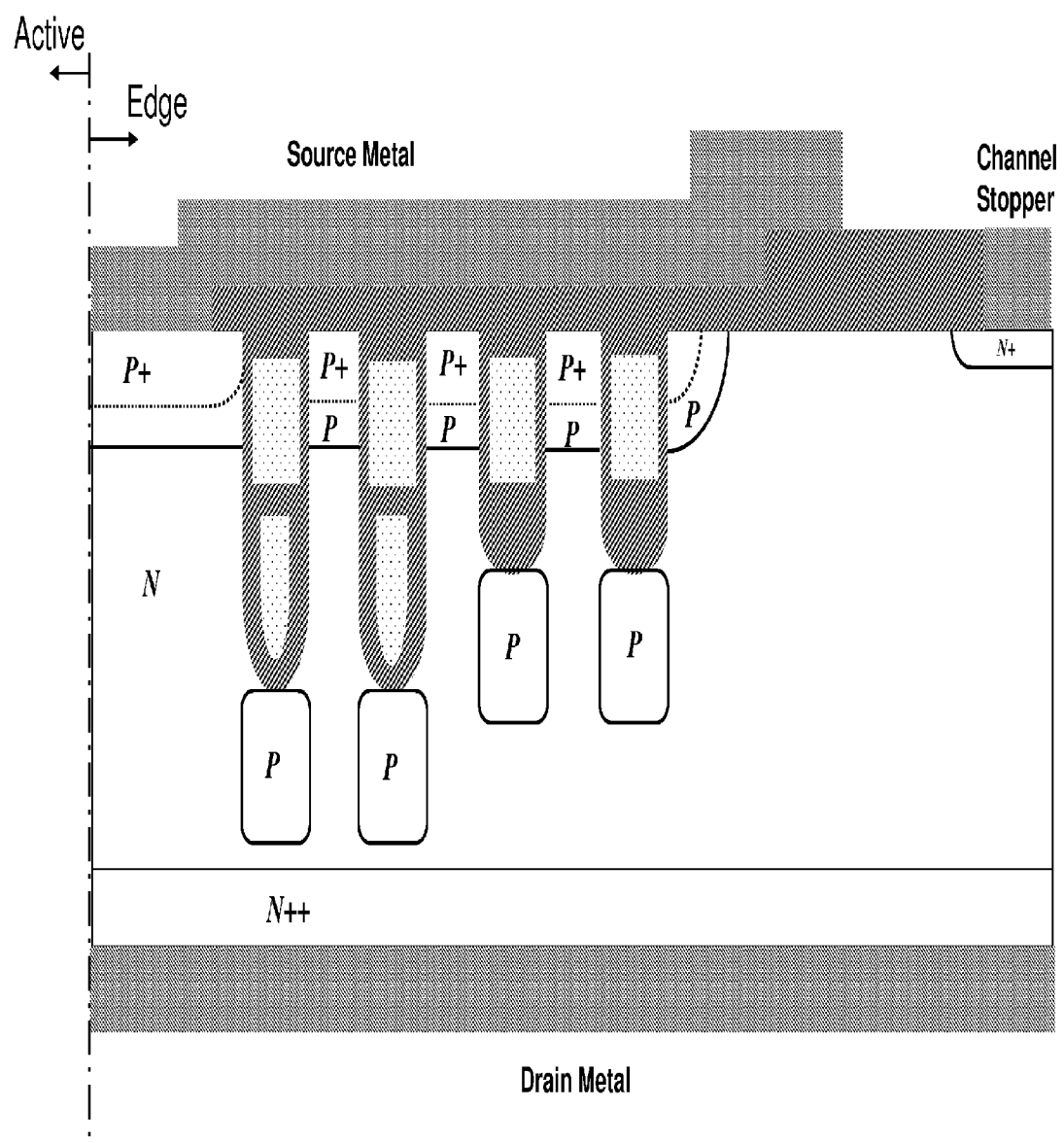
FIG. 37 Edge Termination Structure

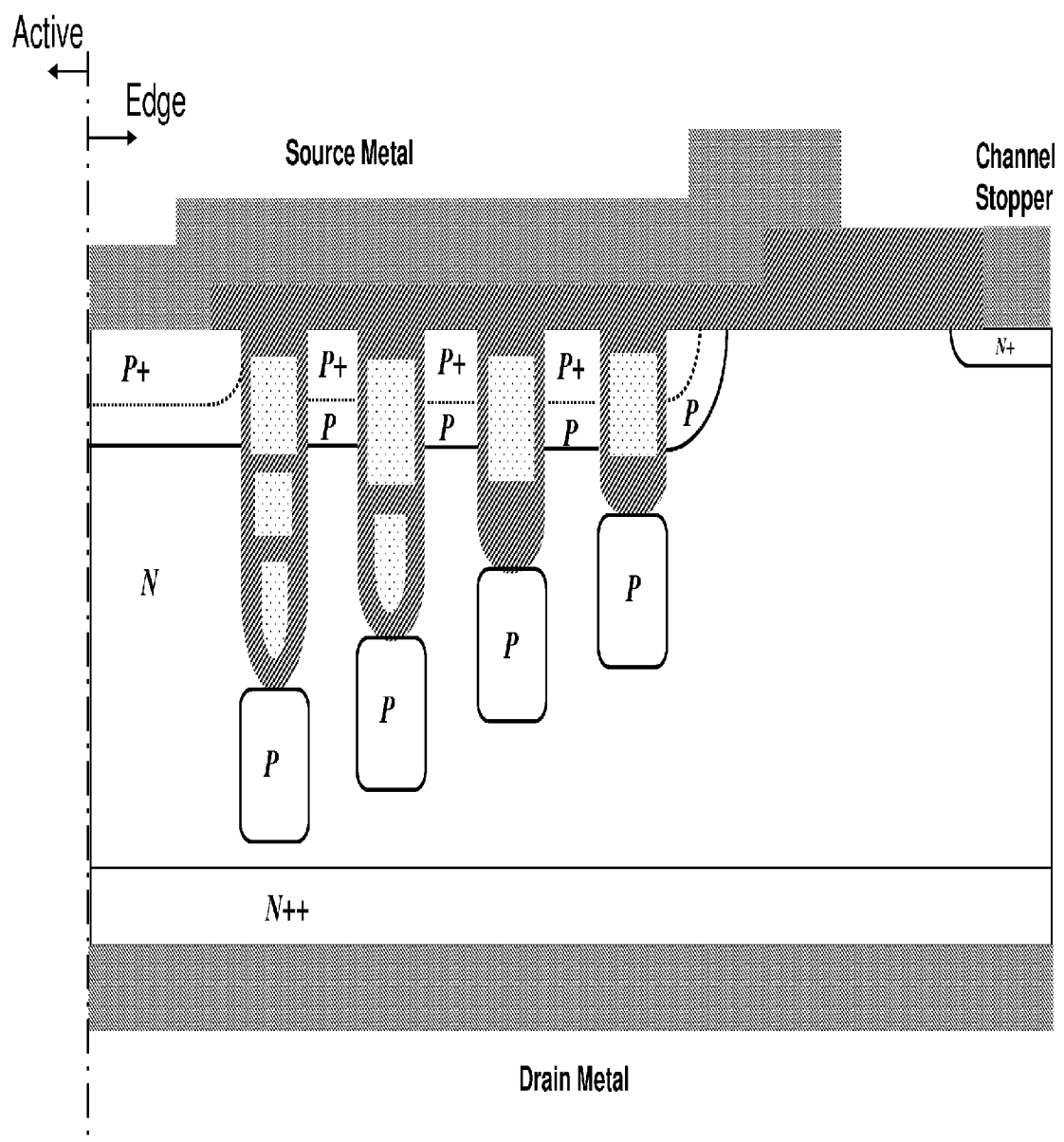
FIG. 38 Edge Termination Structure

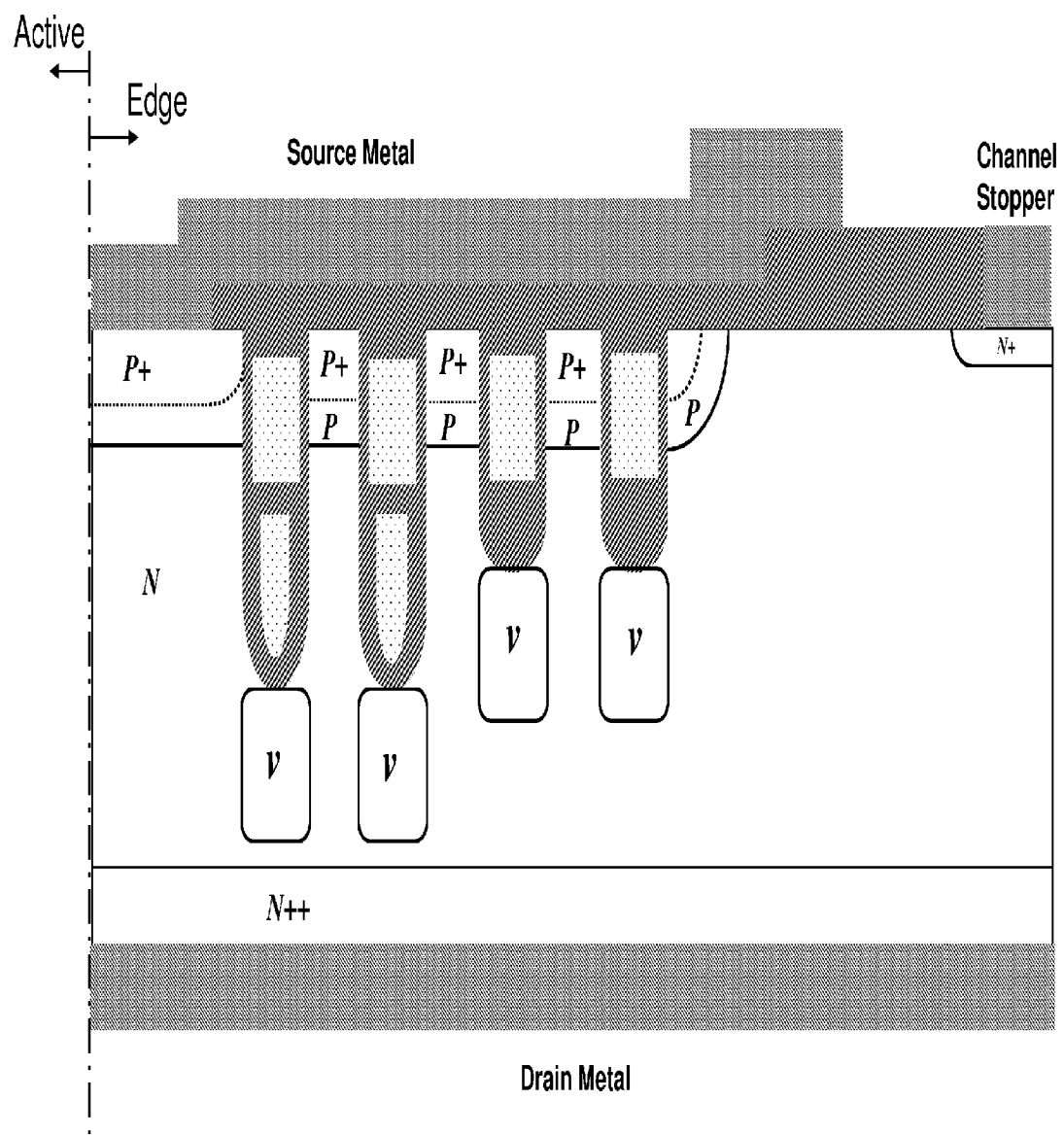
FIG. 39 Edge Termination Structure

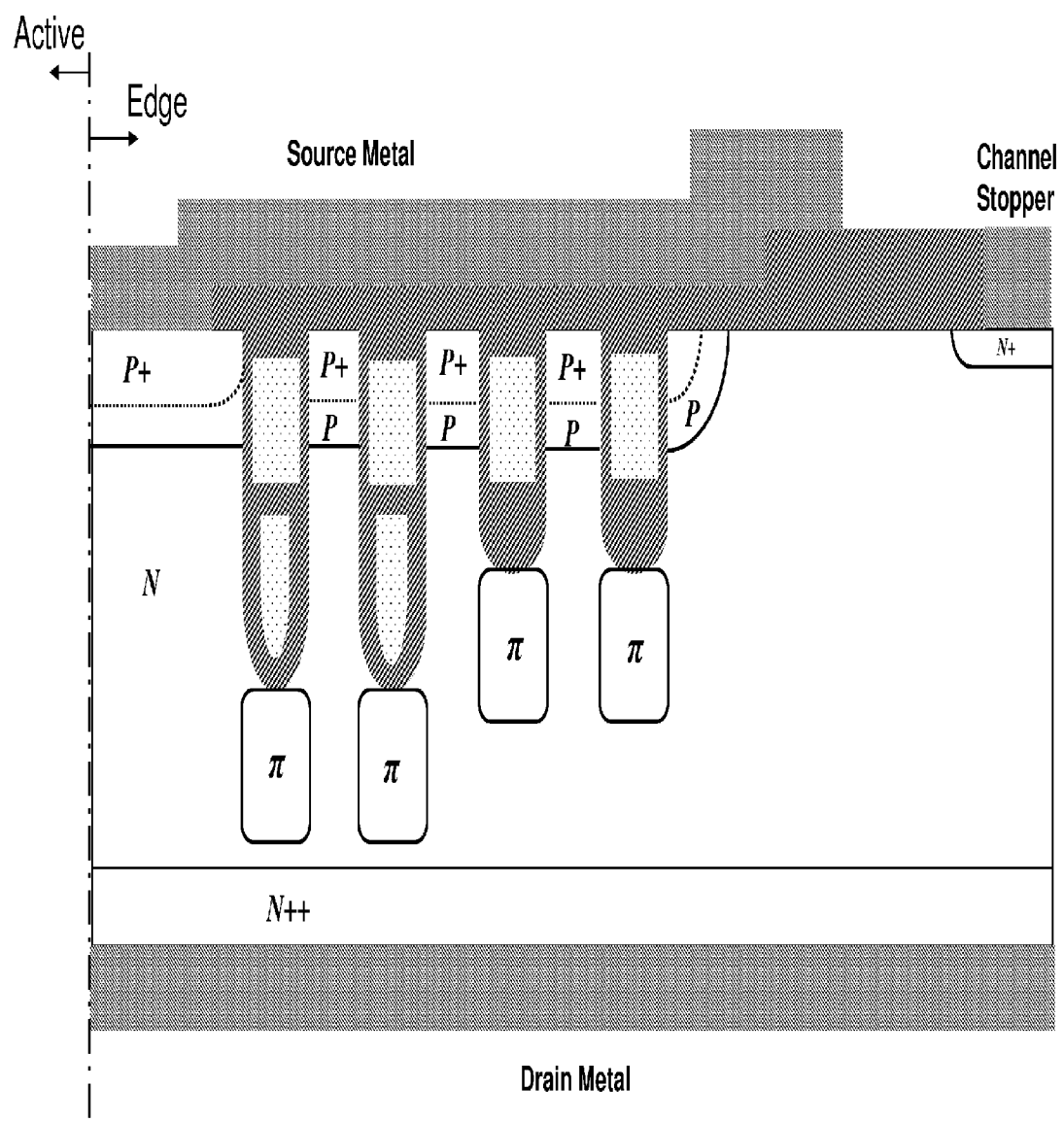
FIG. 40 Edge Termination Structure

POWER MOSFET AND ITS EDGE TERMINATION

BACKGROUND

Power MOSFETs are widely used as switching devices in many electronic applications. In order to minimize the conduction power loss it is desirable that power MOSFETs have a low specific on-resistance ($R_{SP}$ or R*A), which is defined as the product of the on-resistance of the MOSFET multiplied by the active die area. In order to minimize the switching loss it is desired that power MOSFETs have low input and output capacitances. The most common way to reduce the $R_{SP}$ is to shrink the device's unit cell and pitch increase the packing density or number of cells per unit area. However, as the cell density increases, the associated intrinsic capacitances of the device, such as the gate-to-source capacitance (Cgs), the gate-to-drain capacitance (Cgd), the total input capacitance (Ciss), and the total output capacitance (Coss), also increase. As the consequence, the switching power loss of the device will increase. Therefore, it is desirable to develop a device with the best trade-off between the conduction loss and the switching loss, leading to the lowest conduction loss and the lowest switching loss at the same time.

Currently, there are two common techniques to improve the switching performance of power MOSFETs. The first one is the trench-gated MOSFET with thick bottom oxide, as shown in FIG. 1 (U.S. Pat. No. 6,849,898). The second one is the split poly gated MOSFET structure, in which the first poly gate is electrically shorted to the source electrode (U.S. Pat. Nos. 5,998,833, 6,683,346). This is illustrated in FIG. 2.

Most recently, US Patent Publication Nos. 2008/0073707 and 2009/0206924 disclosed the further improved Power MOSFET structures to realize a very short channel region (~0.25 µm) to further reduce the device on-resistance $R_{SP}$ and the gate-source capacitance as well as the gate-drain capacitance. These device structures are illustrated in FIG. 3 and FIG. 4. In addition to the increase of the channel density and the reduction of channel length for decreasing the device on-resistance, the so-called charge balance technique (U.S. Pat. Nos. 5,216,275 and 5,438,215) has been proposed to achieve a flat electric field distribution in the device drift region. Consequently, the doping concentration of the drift region can be raised and the on-resistance of the device for a given breakdown voltage can be lowered significantly.

SUMMARY

Improved MOSFET structures and processes, where an upper field plate portion shields the electric field from penetrating into the channel, so that a very short channel can be used without jeopardizing the device drain-source leakage current; and a lower field plate portion modulates the electric field distribution in the drift region, such that a more uniform field distribution can be obtained.

BRIEF DESCRIPTION OF THE DRAWINGS

FIG. 6 shows the electrostatic potential contours at the onset of the avalanche breakdown of the device in FIG. 2 and the new device in FIG. 5d.

FIGS. 7-18 show a first process technique for fabrication.

FIGS. 19-26 show a second manufacturing process for fabrication.

FIGS. 32-40 show a variety of structures which can be used for edge termination with the devices described above.

DETAILED DESCRIPTION OF SAMPLE EMBODIMENTS

In this application, a further improved MOSFET structures and fabrication processes are disclosed. The architectures of the new concept are shown from FIGS. 5a to 5f. As can be seen, the new devices have several notable features.

The first feature is that multiple embedded polysilicon regions are introduced into the n+ source contact area. The top poly layer, named "PolySi Field Plate#1", is used to shield the electric field from penetrating into the channel, so that a very short channel can be used without jeopardizing the device drain-source leakage current IDSS. The bottom poly layer, named "PolySi Field Plate#2", is used to modulate the electric field distribution in the drift region such that a more uniform field distribution can be obtained. This polysilicon field plate can be either electrically shorted to the Source metal, or some of these field plates can be floating if more than two field plates are used as shown in FIG. 5e. Furthermore, each polysilicon plate's length can be adjusted independently for achieving its best function. This is demonstrated through FIGS. 5a to 5c. For example, in order to enhance the field shield of the MOS channel, the "PolySi Field Plate#1" is extended as given in FIG. 5b. On the other hand, if field shaping is needed in the drift region, then the "PolySi Field Plate#2" can be elongated as shown in FIG. 5c.

The second feature is having the additional P-type shield layer underneath the field plate trench bottom. This P shield layer provides a further optimized electric field distribution during the device's off-state blocking operation, and more uniform field distribution can be achieved. Consequently, a higher breakdown voltage can be obtained, and a heavily doped drift/EPI layer can be used for a given breakdown voltage. Additionally, the P shield region also reduces the voltage across the dielectric layer between the trench bottom poly region and the N epitaxial layer when a high drain-source voltage is applied. As a result, the bottom polysilicon field plate will offer a more reliable long life operation under conditions of high drain-to-source voltage.

Figure 5A:
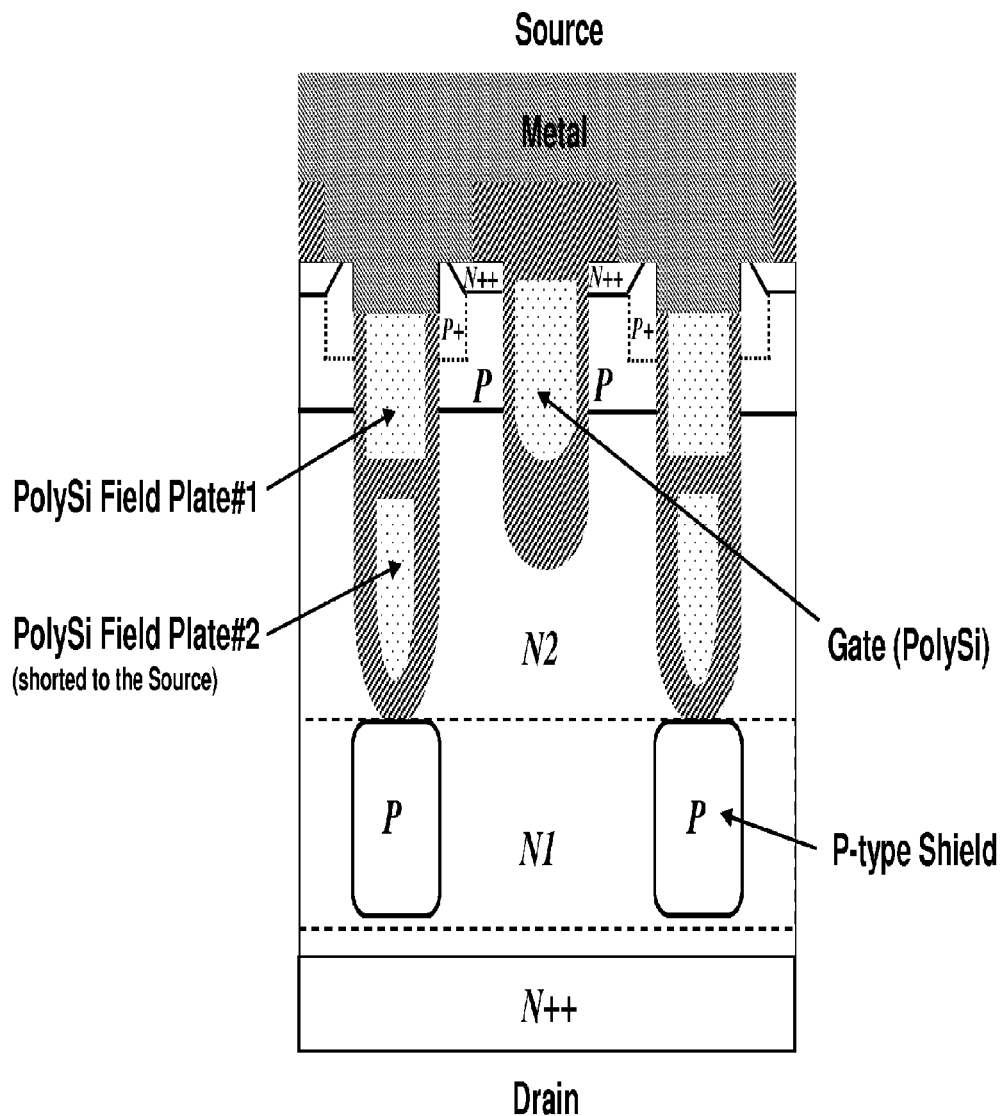
FIGS. 5a-5f illustrate various aspects of the disclosed architectures.
Figure 5B:
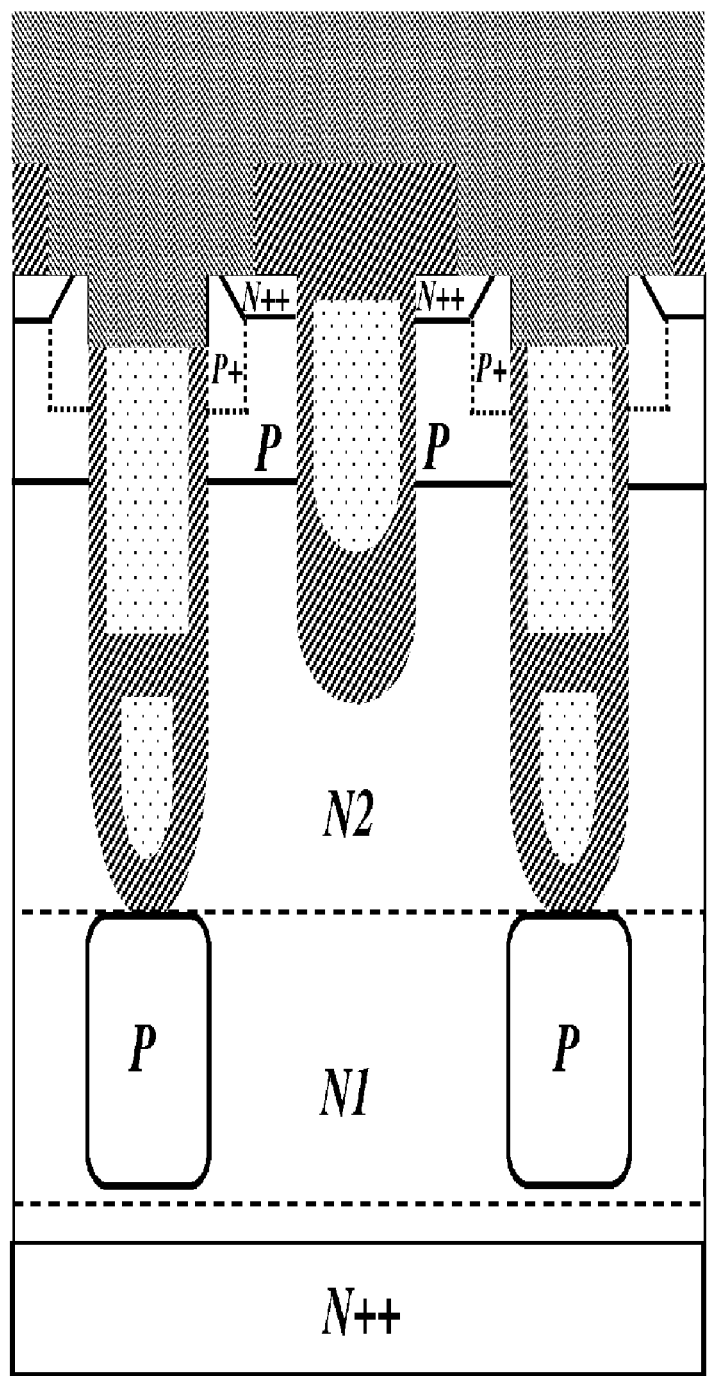
Figure 5C:
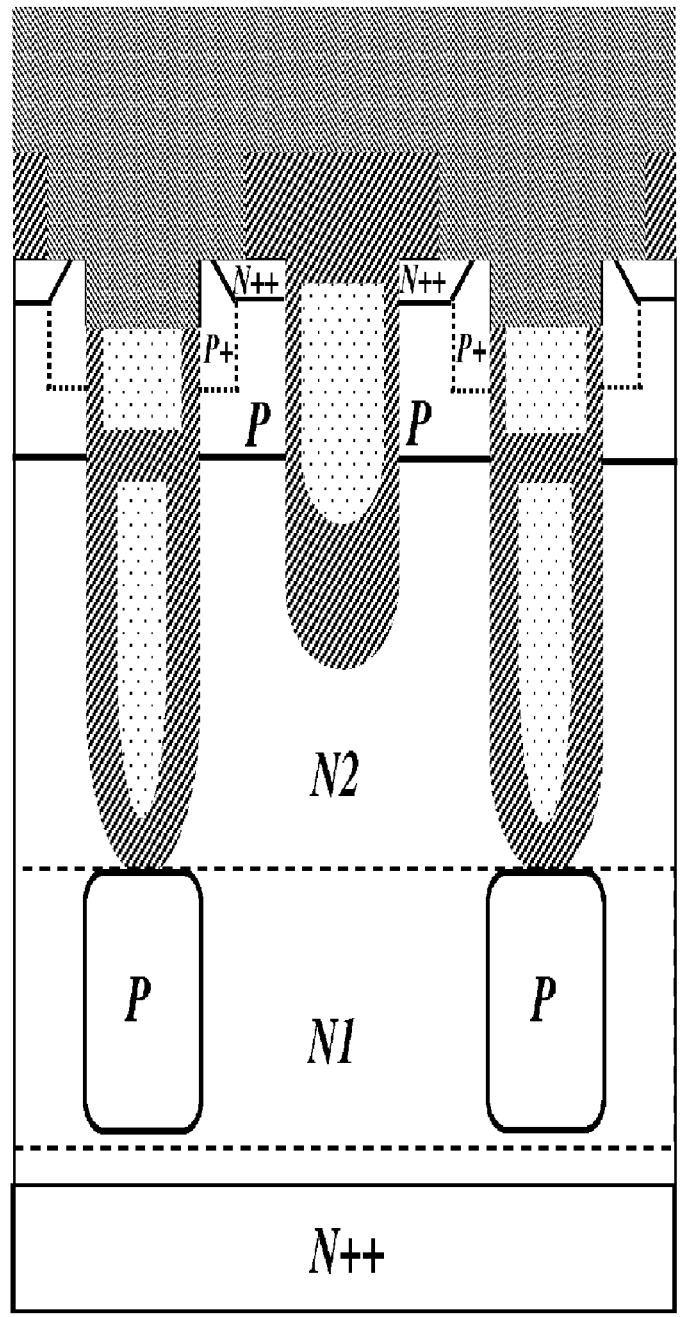

The third feature is that the doping concentration of drift/EPI layer can be adjusted in a segmental manner in conjunction with each polysilicon field plate as shown in FIG. 5a, etc. The doping concentration of each drift/EPI layer (such N1, N2, and N3) is properly chosen to yield a more constantly distributed electric field inside the whole drift region. As a result, the highest breakdown voltage and lowest on-resistance $R_{SP}$ can be realized.

Figure 2:
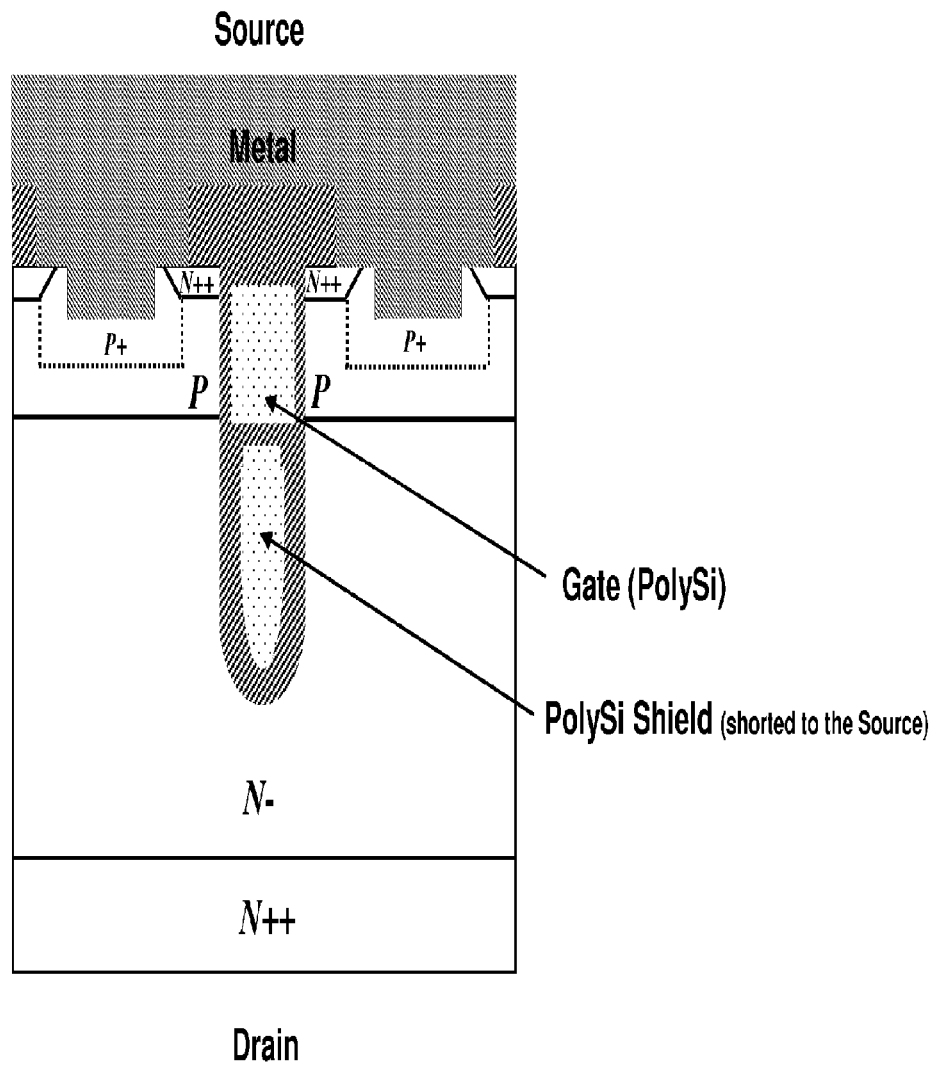

Detailed process/device simulations have been performed to validate the new technique and conclusions as described in the previous paragraph. FIG. 6 shows the electrostatic potential contours at the onset of the avalanche breakdown of the device in FIG. 2 and the new device in FIG. 5d. Both devices have the same EPI thickness and doping concentration. The new device has about 10V higher breakdown voltage than the prior art device. Additionally, the breakdown electric field magnitude is less, and its distribution is more uniform, in the new device.

Electrical parameters of prior devices and the new device have been comparatively studied by simulations. The results are summarized in Table I. As can be seen, the new device can offer the best performance of the conduction and switching characteristics. Note that in the simulation of FIG. 5d, a uniformly doped EPI layer was used, i.e., N1 is equal to N2.

The key fabrication process techniques for making the new MOSFET described in this invention are also disclosed here. The first process technique is demonstrated through the sequence in FIGS. 7 to 18.

Starting with an N+ substrate, an N− EPI layer with an initial doping concentration of N1 is grown on the substrate. This is followed by the oxidation process.

Figures 7, 8:
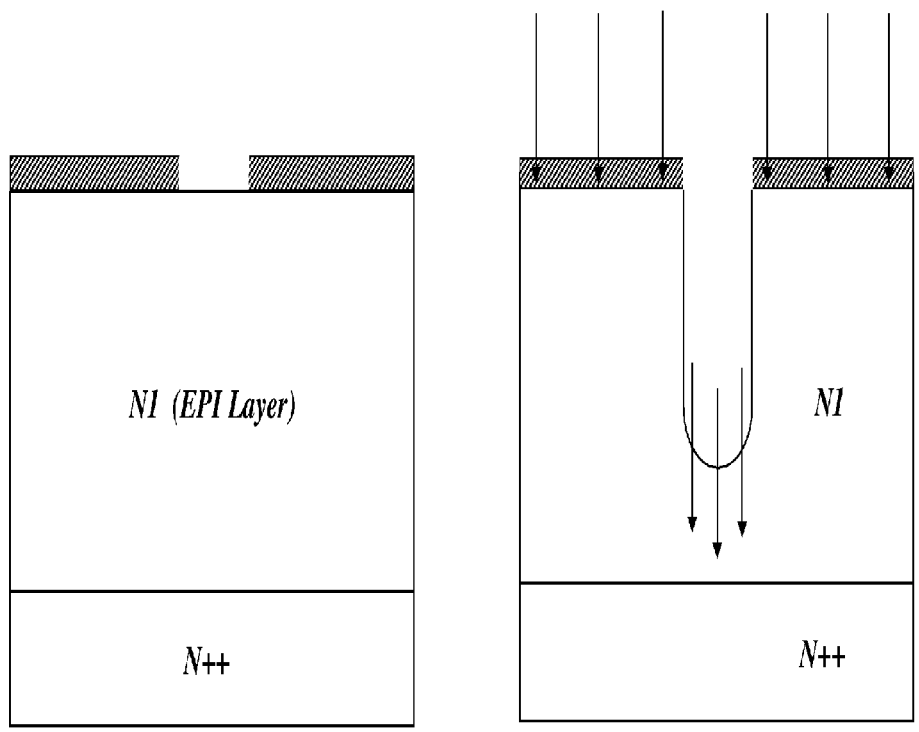

The first trench mask is applied to form the hard mask for trench etch (FIG. 7). The silicon etch step is carried out to create the trench followed by sacrificial oxidation step.

Then, the P-type dopant (e.g., Boron) is implanted into the trench bottom (FIG. 8). Note that multiple implant steps with different implant energy and dose can be utilized here.

Figures 9, 10:
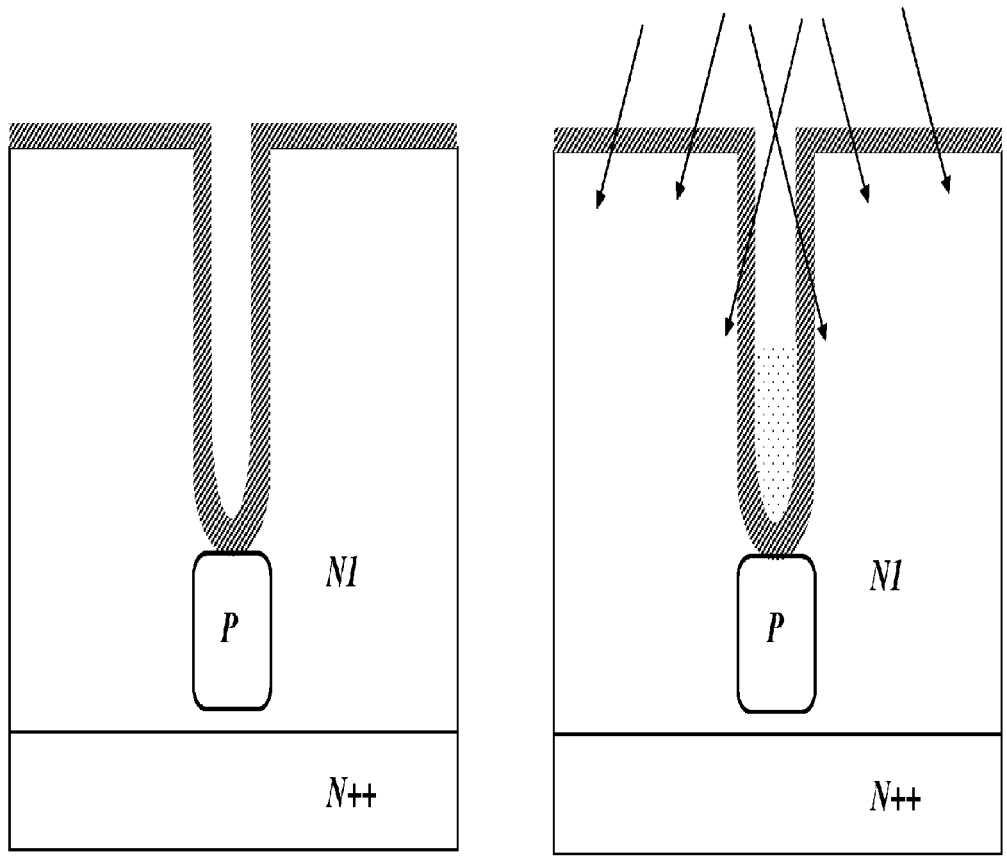

After removal of the hard mask, a field oxide is grown on the silicon surface and the trench sidewall (FIG. 9).

The polysilicon deposition fills the trench followed by the polysilicon recess etchback as shown in FIG. 10. At this point, the N-type dopant (e.g., Phosphorous) is implanted into the recessed trench sidewall to locally enhance the doping concentration of EPI layer (FIG. 10). Again, the multiple implant steps with different implant energy and dose can be utilized here also. A thermal anneal can be employed here to spread out this N-type dopant to form the N2 layer.

Figure 11:
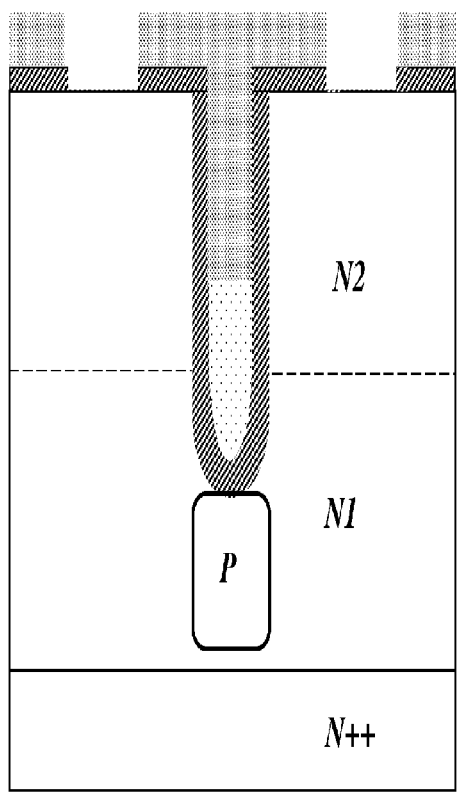

Then, a second trench mask is employed to define the second trench opening (FIG. 11).

Figure 12:
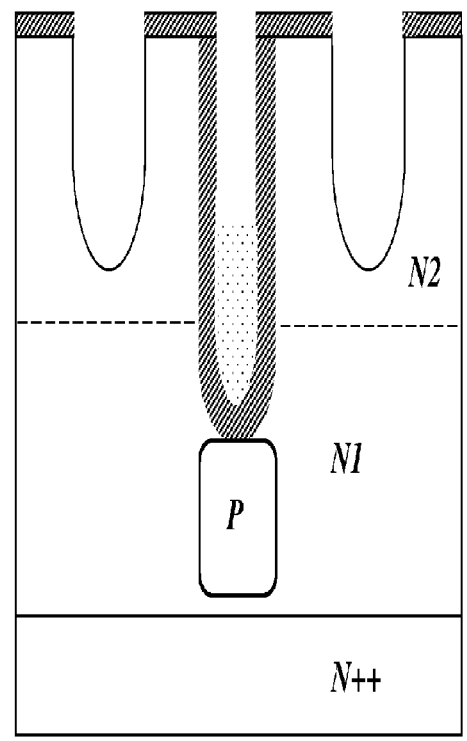

Next, the silicon is etched to form the second trench (FIG. 12).

Figures 13, 14A:
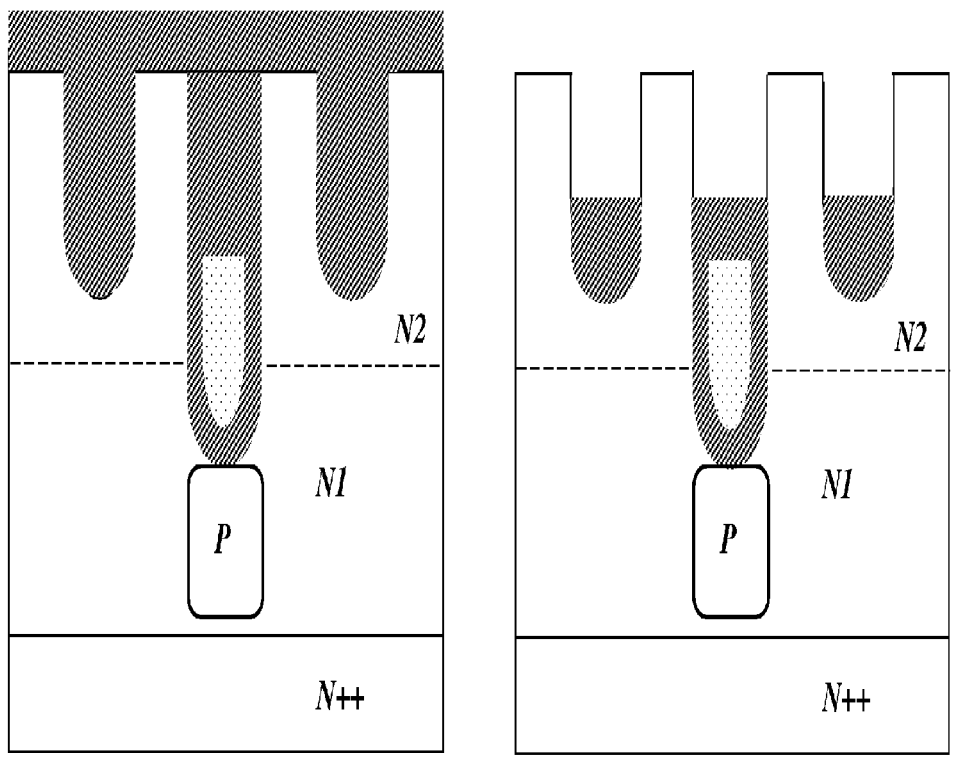

After removal of the photoresist, an oxide filling and planarization process are carried out to fully fill all of the trenches (FIG. 13).

Figures 14B, 15:
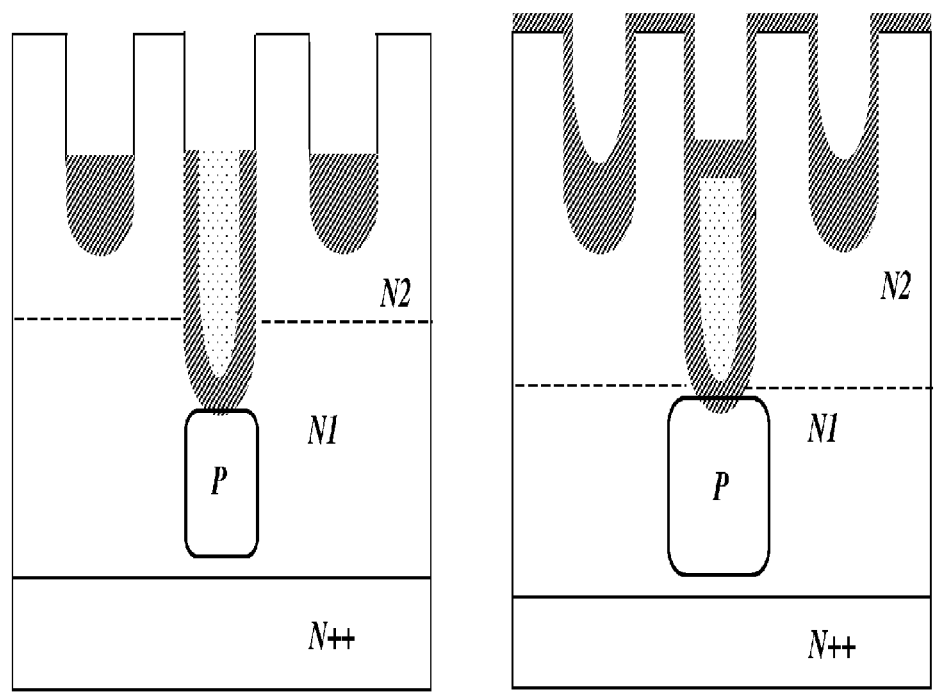
Figures 16, 17:
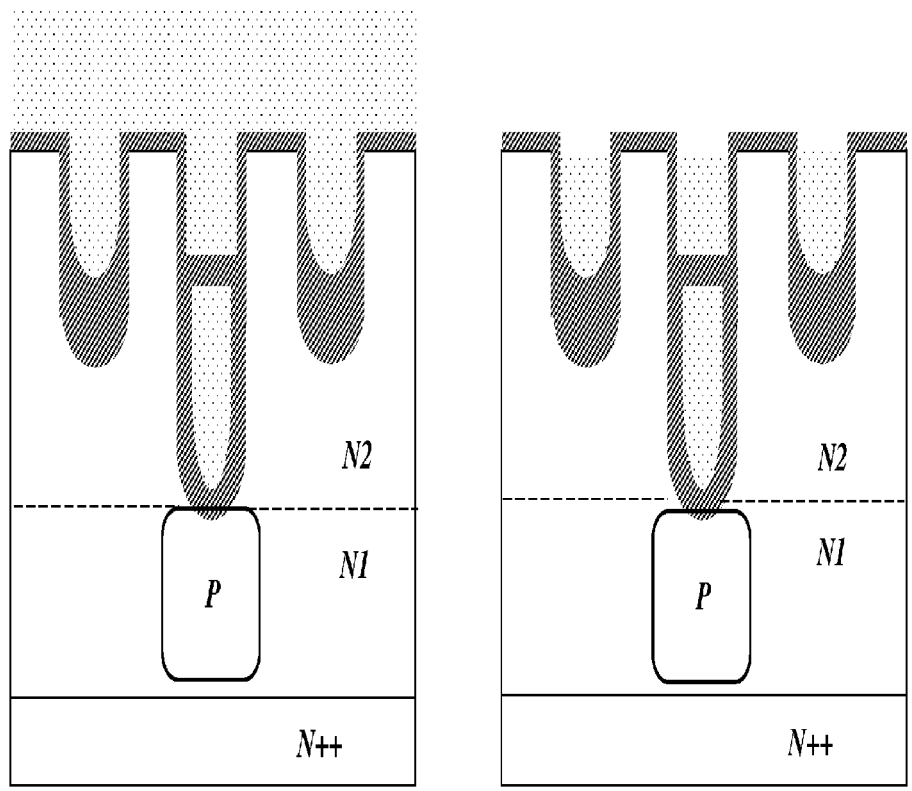
Figure 18:
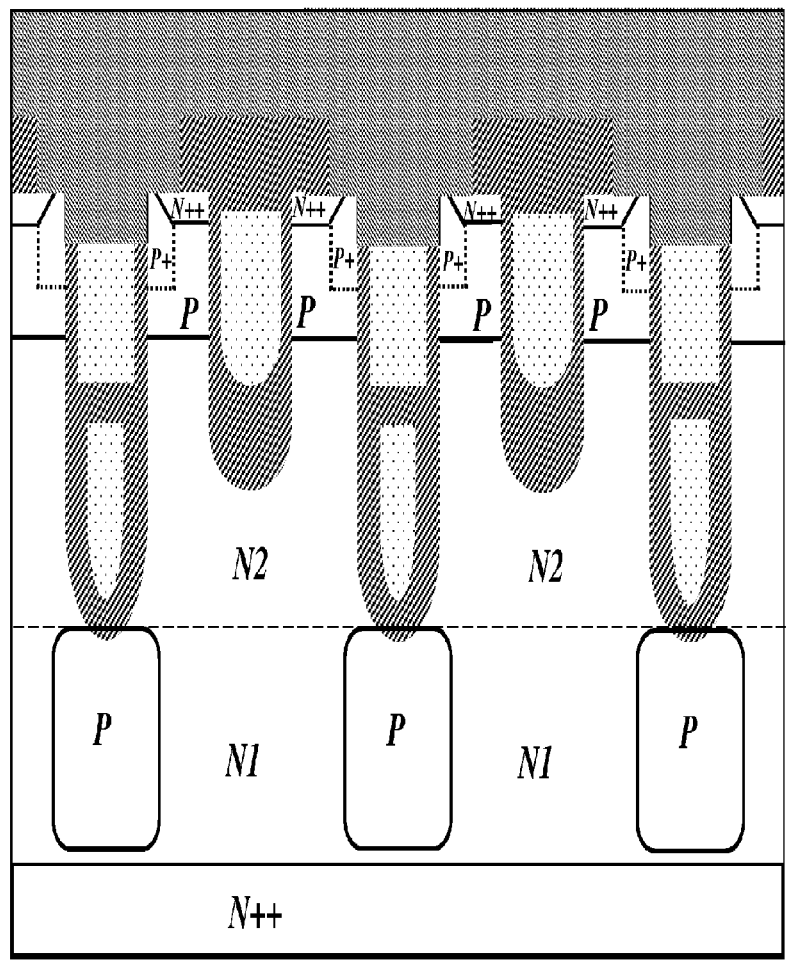

Using the active mask, the remaining oxide is etched further down into trench forming the trench bottom oxide layer (BOX) (FIGS. 14a and 14b). Note that, depending on the depth of the first polysilicon layer inside the deeper trench, the BOX layer can still cover the polysilicon layer as shown in FIG. 14a, or can be completely removed as shown in FIG. 14b.

Next, the gate oxide is grown along the trench sidewall (FIG. 15).

Then, the second polysilicon deposition/fill (FIG. 16) and etchback processes (FIG. 17) are performed for creating the gate polysilicon region. From here, the rest of the process steps are similar to the those described in copending Publication Nos. 2008/0073707 and 2009/0206924. The final device structure is displayed in FIG. 18.

The second manufacturing process is demonstrated through FIGS. 19 to 26. Starting with an N+ substrate, an N− epitaxial layer is grown, followed by the oxidation or oxide deposition.

Figure 19:
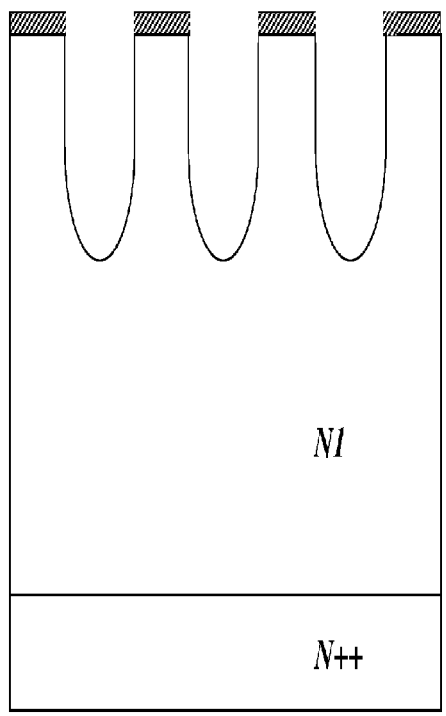

A trench mask is applied to form the hard mask for silicon trench etch (FIG. 19).

Figure 20:
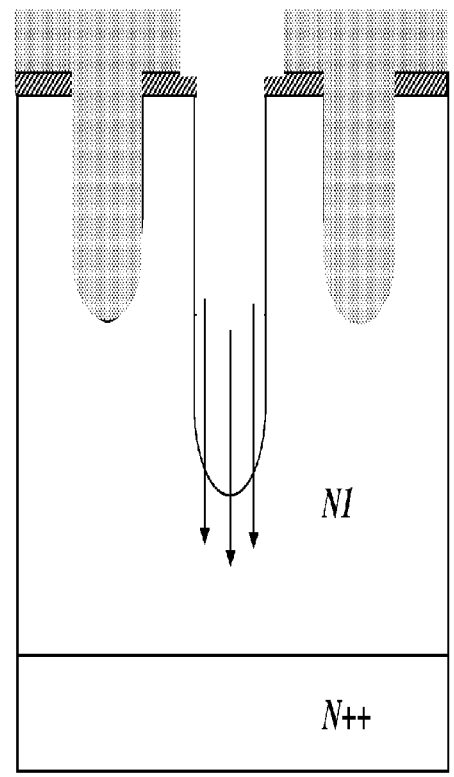

After the silicon trench etch, a second mask is used to cover the trenches shown on the left and right, and then a silicon etch is utilized again to produce the deep trench in the center, followed by P-type dopant implantation (FIG. 20).

Figure 21:
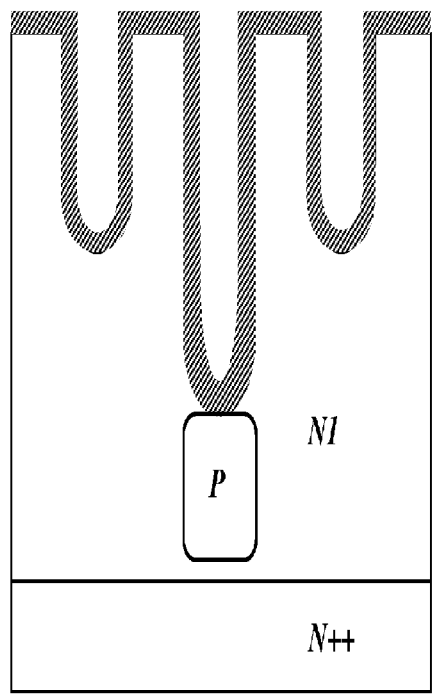

After removal of the photoresist and the oxide hard mask, a field oxide is grown on the silicon surface and the trench sidewall (FIG. 21).

Figure 22:
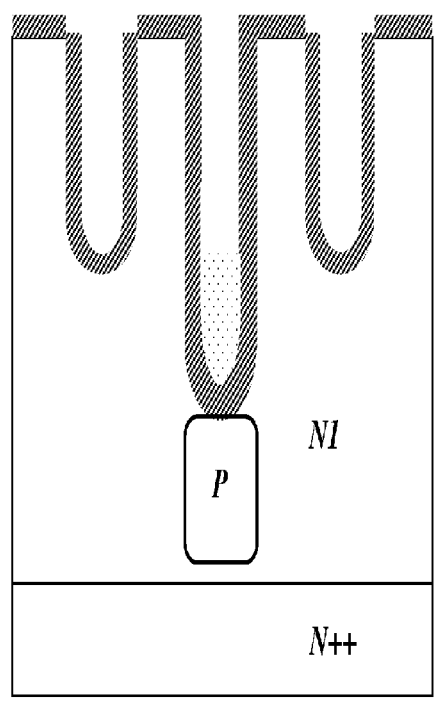

The polysilicon fill/planarization and the recess etch are employed to form the structure shown in FIG. 22. Note that the polysilicon layer in the shallow trench should be completely etched away at this process step.

Figure 23:
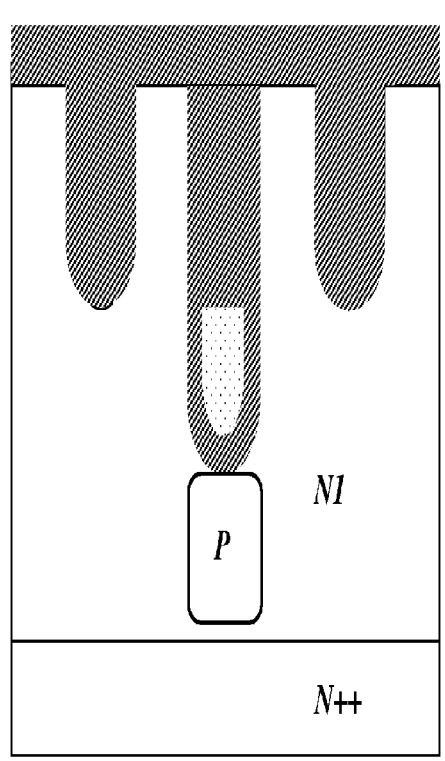

Next, oxide filling and planarization are used to fully fill all of the trenches (FIG. 23).

Figure 24:
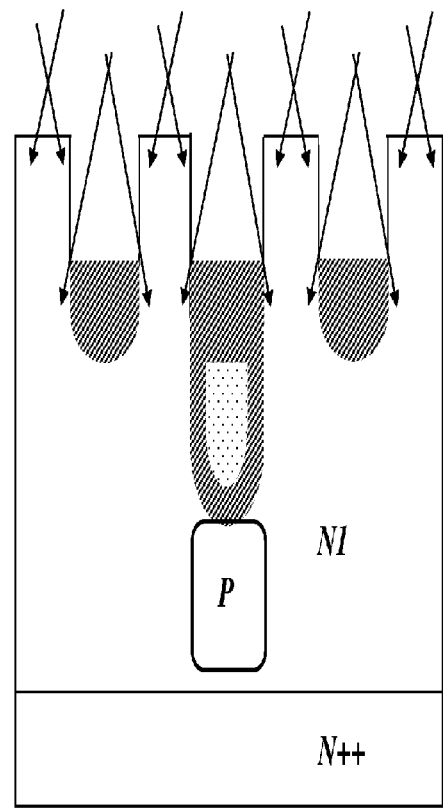

After the oxide etchback to form the BOX layer, an N-type dopant (e.g., Phosphorous) is implanted into the recessed trench sidewall to locally enhance the doping concentration of EPI layer (FIG. 24). The rest of the process steps are generally the same as described above: FIG. 25 shows oxide growth and gate polysilicon fill; FIG. 26 shows gate poly etchback, etc.

Figure 27A:
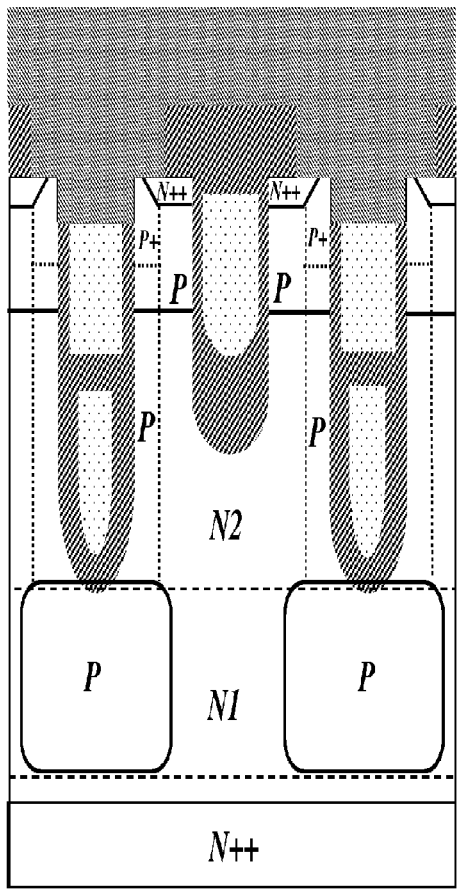
FIGS. 27a-27b show an alternative device structure, where the P shield layer is shorted to the P body.
Figure 27B:
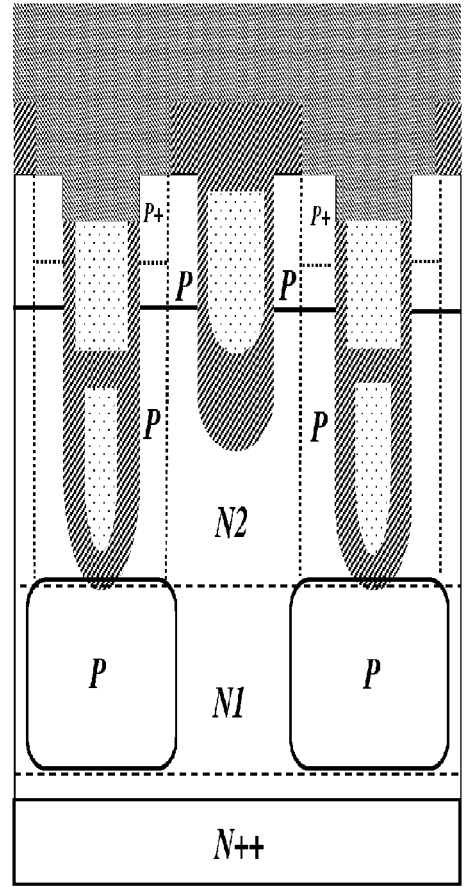

In addition to the basic concept disclosed here, a variety of alternative device structures can be developed. For example, the P shield layer can be shorted to P body as shown in FIGS. 27a and 27b. This short can be achieved by a high energy/low dose implant followed by a thermal anneal process after the contact recess etch (the same skill described in the prior art 2009/0206924). Considering its impact of this implant on the channel doping, the implant can be done only periodically along the trench direction (as shown in FIG. 27a) or only done at the periphery of the device (as shown in FIG. 27b) where N++ source is excluded.

Figure 28A:
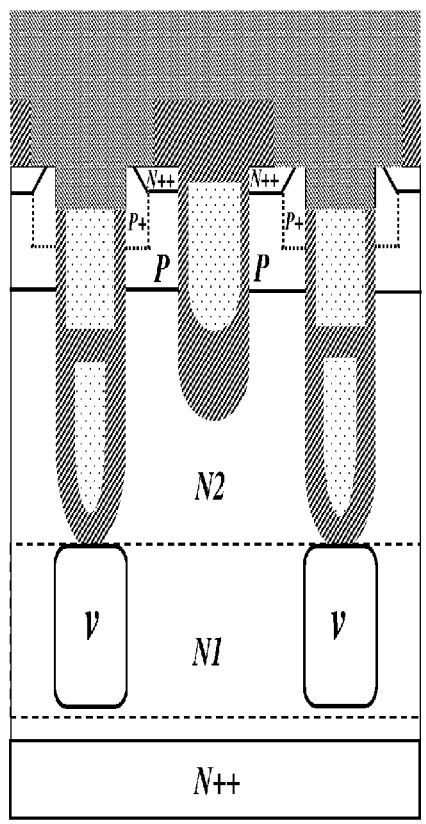
FIG. 28a shows an alternative device structure, where the P shield region is replaced by a π region.
Figure 28B:
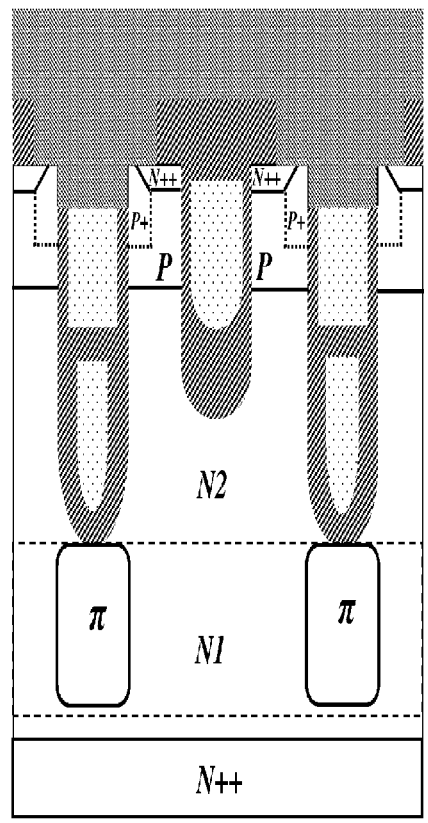
FIG. 28b shows an alternative device structure, where the P shield region is replaced by a ν region.

In addition, the P shield region can be replaced either by a π region (very lightly P-type doped) or by a ν region (very lightly N-type doped). These are respectively illustrated in FIG. 28b and FIG. 28a. The use of lightly doped shield regions (either ν or π) reduces the pitching resistance in the area, and also diminishes the impact on device on-resistance during the device switching-off to switching-on dynamic process. A better trade-off between the total losses (including the conduction loss and the switching loss) and the breakdown voltage is expected when either a ν or π region is used instead of a highly doped P region for the device with a very small cell pitch.

Figure 29:
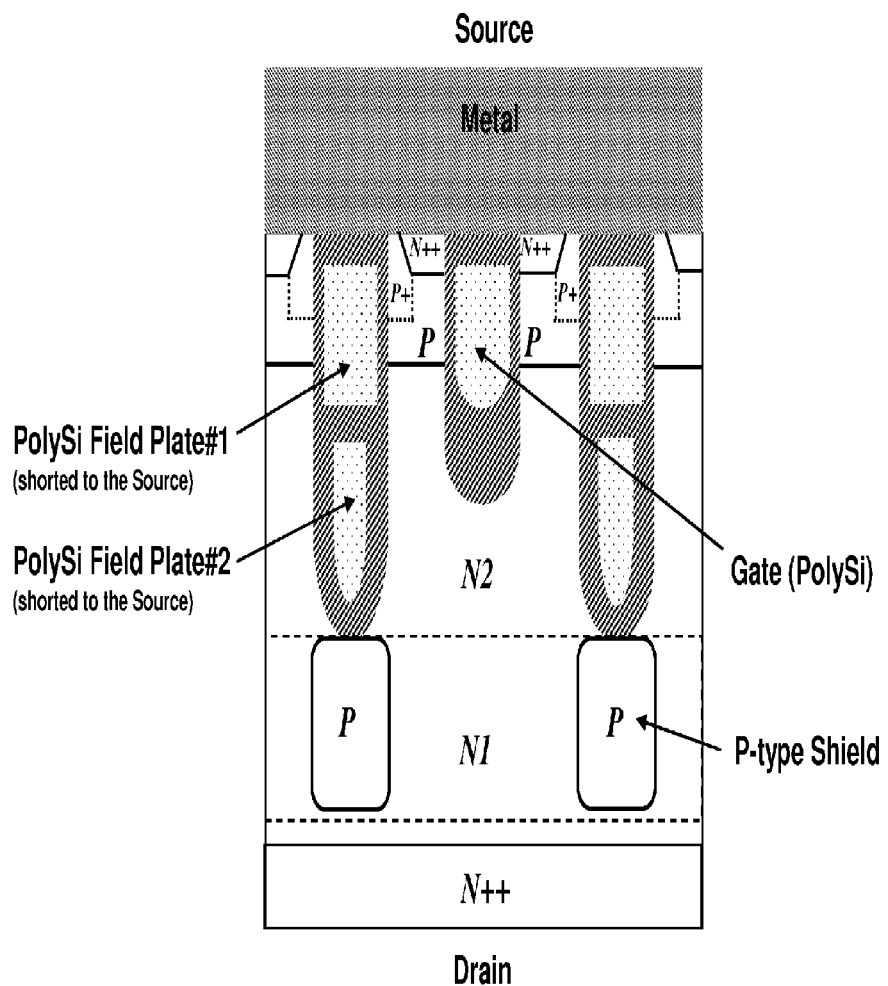
FIG. 29 shows an alternative device structure, where a planarized contact scheme is included.

Furthermore, a planarized contact scheme can be implemented into the new device structures as demonstrated in FIG. 29.

Figure 30:
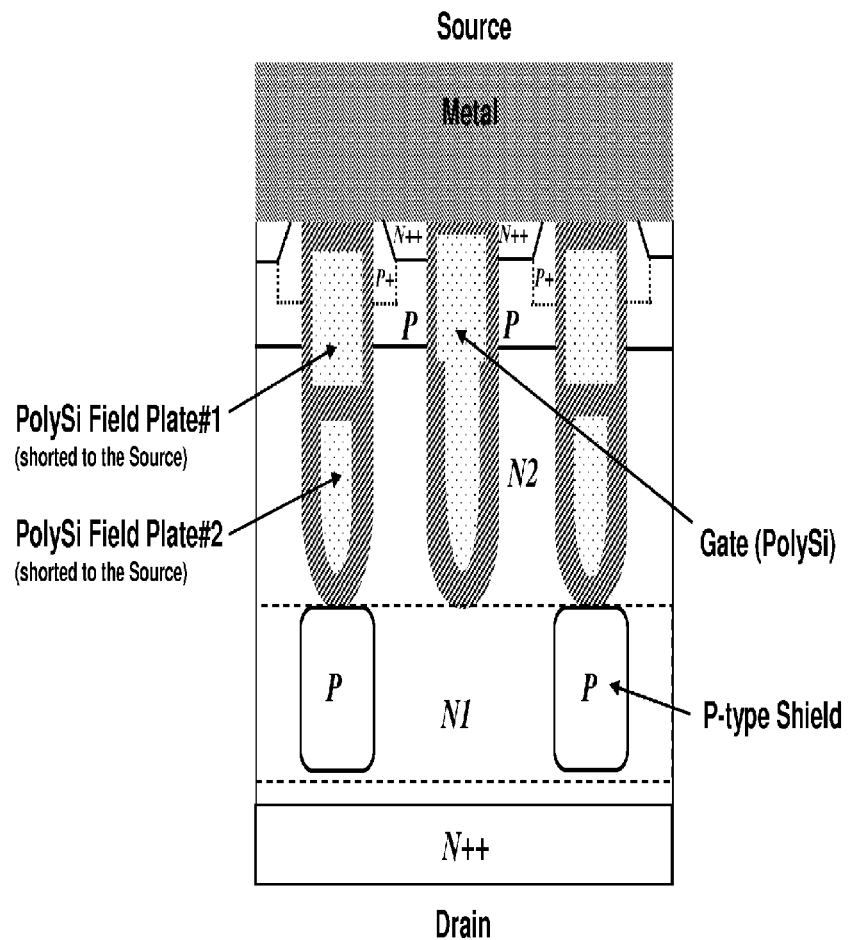
FIGS. 30-31 show alternative device structures where the trench depth of the field plate trenches is the same as the gate trench.
Figure 31:
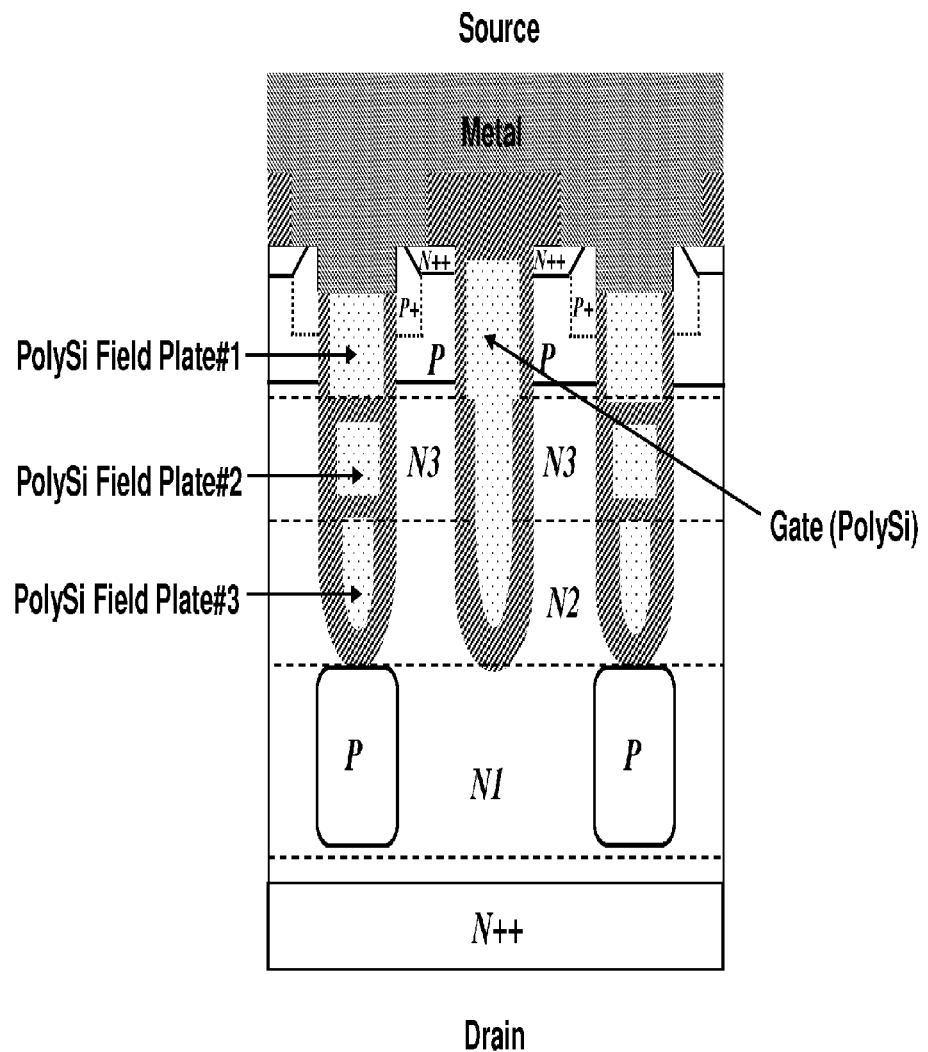

Moreover, the trench depth of all field plate trenches can be made the same as the gate trench. These are illustrated in FIG. 30 and FIG. 31.

Finally, it is essential to point out that, in order to fully realize the improvement on electrical performance of the new device structure disclosed in this invention, a reliable and efficient device edge termination is extremely important.

FIGS. 32 to 40 propose a variety of termination structures which can be used as the edge termination of the new device proposed in previous paragraphs. In these structures, the embedded polysilicon field plate regions are preferred to be electrically floating. The enhanced P body shown near the illustrated P+ region helps to reduce the leakage current of the edge termination for high voltage applications.

TABLE I

Figure 1:
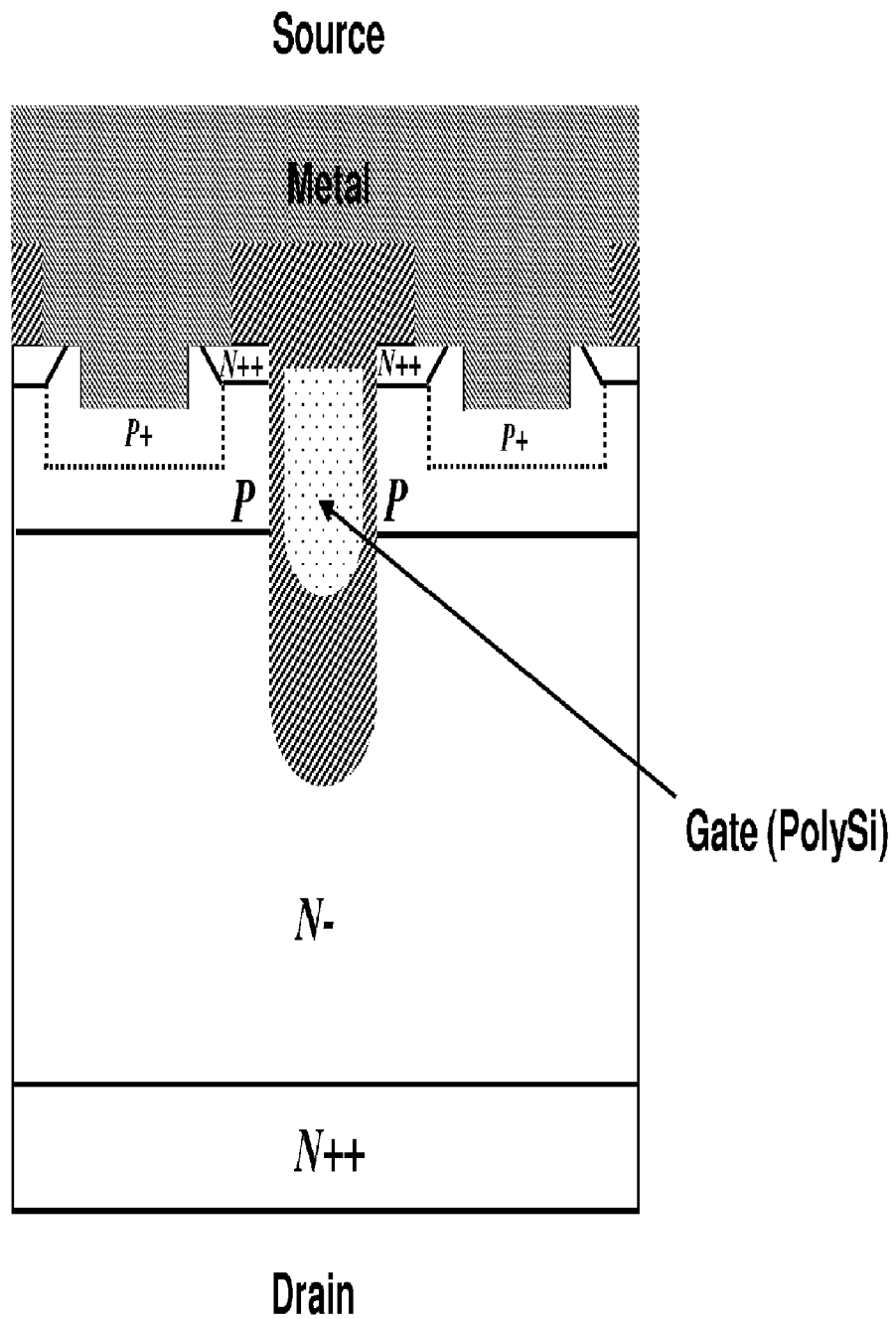
FIGS. 1 and 2 show two common techniques to improve the switching performance of power MOSFETs.
Figure 3:
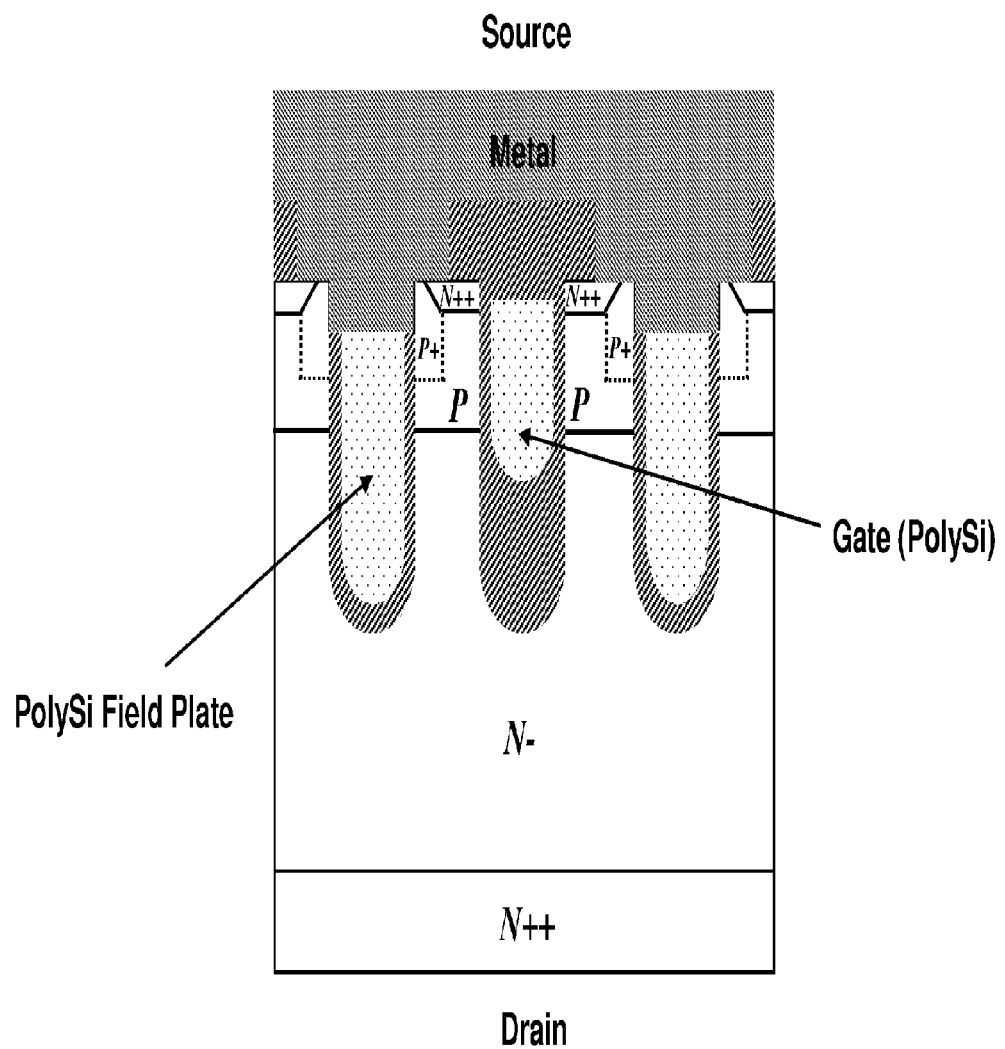
FIGS. 3 and 4 show further improved device structures, from copending Publication Nos. 2008/0073707 and 2009/0206924.
Figure 4:
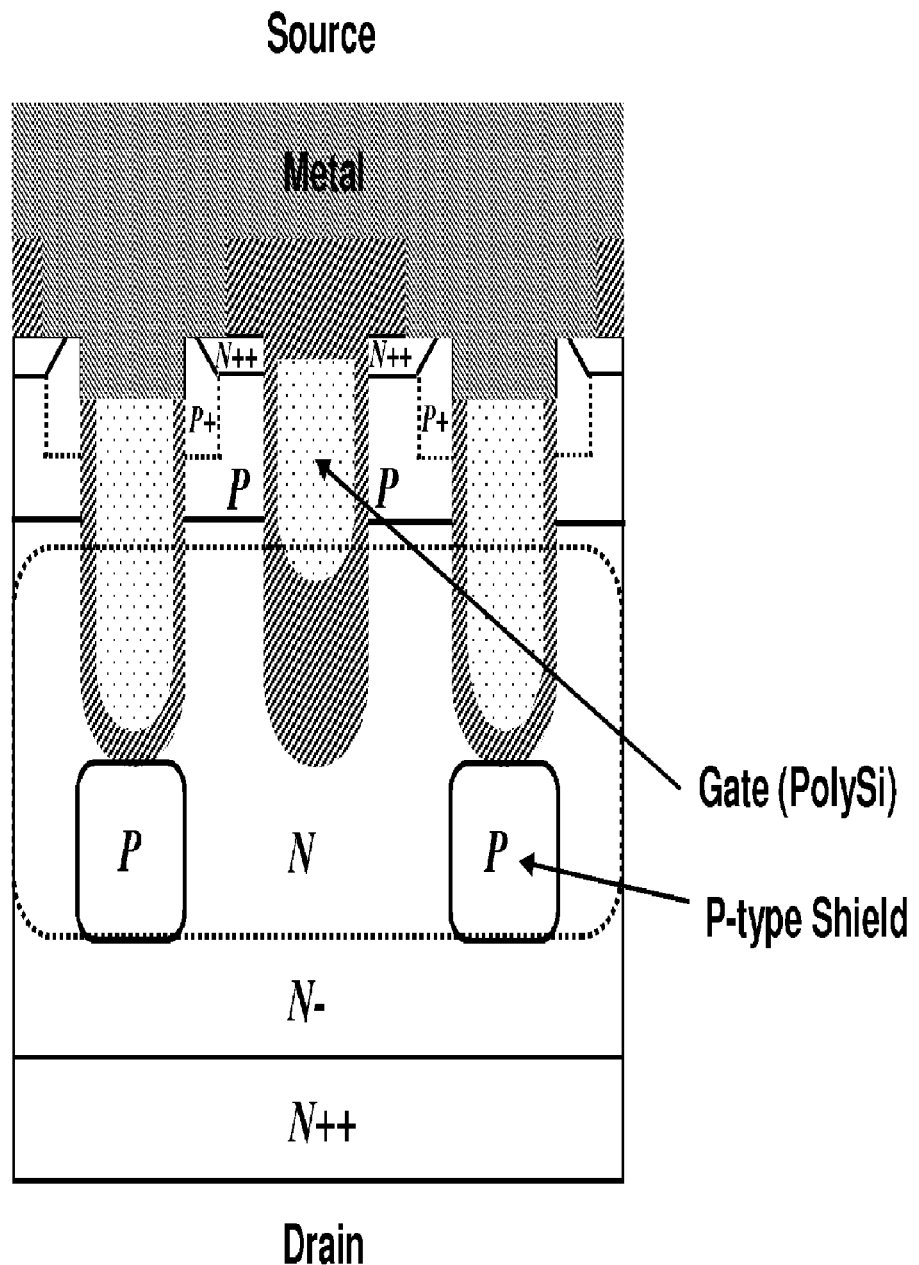
Figure 5D:
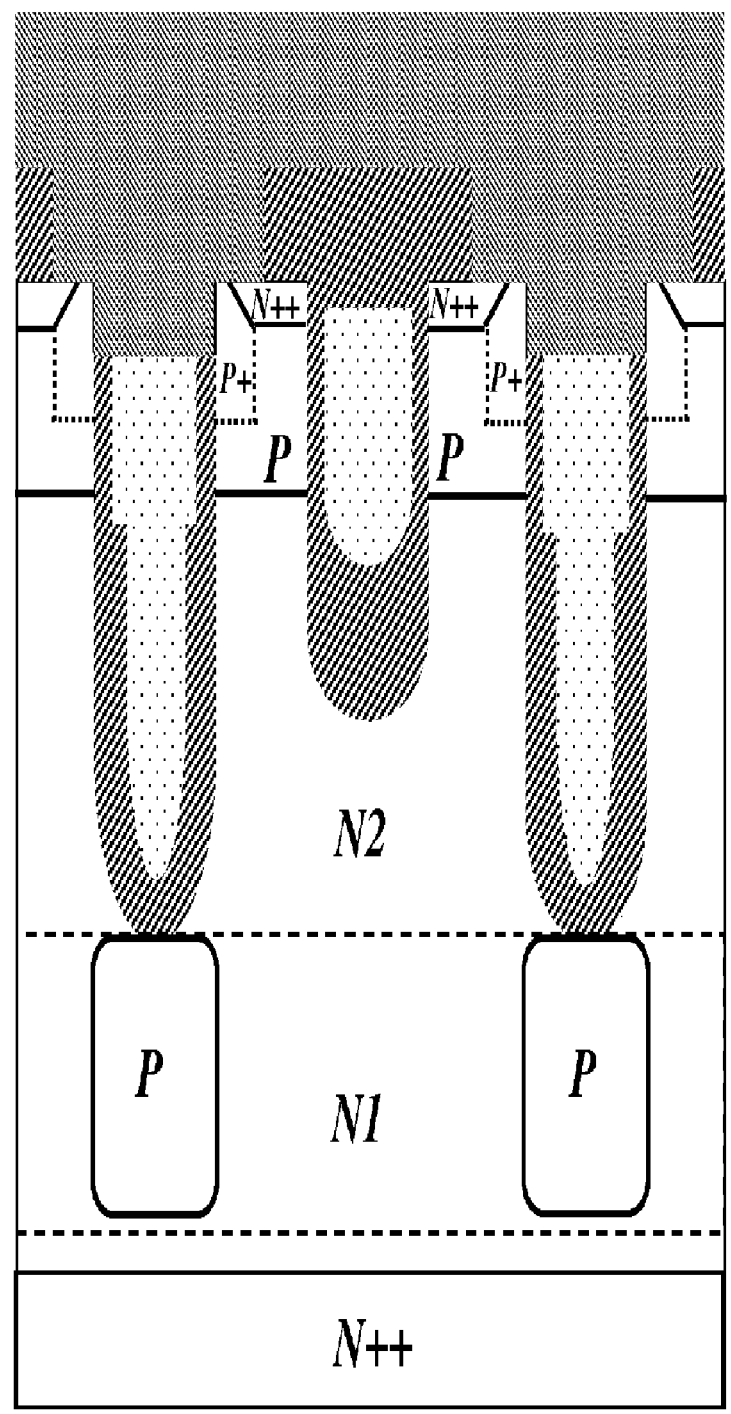
Figure 5E:
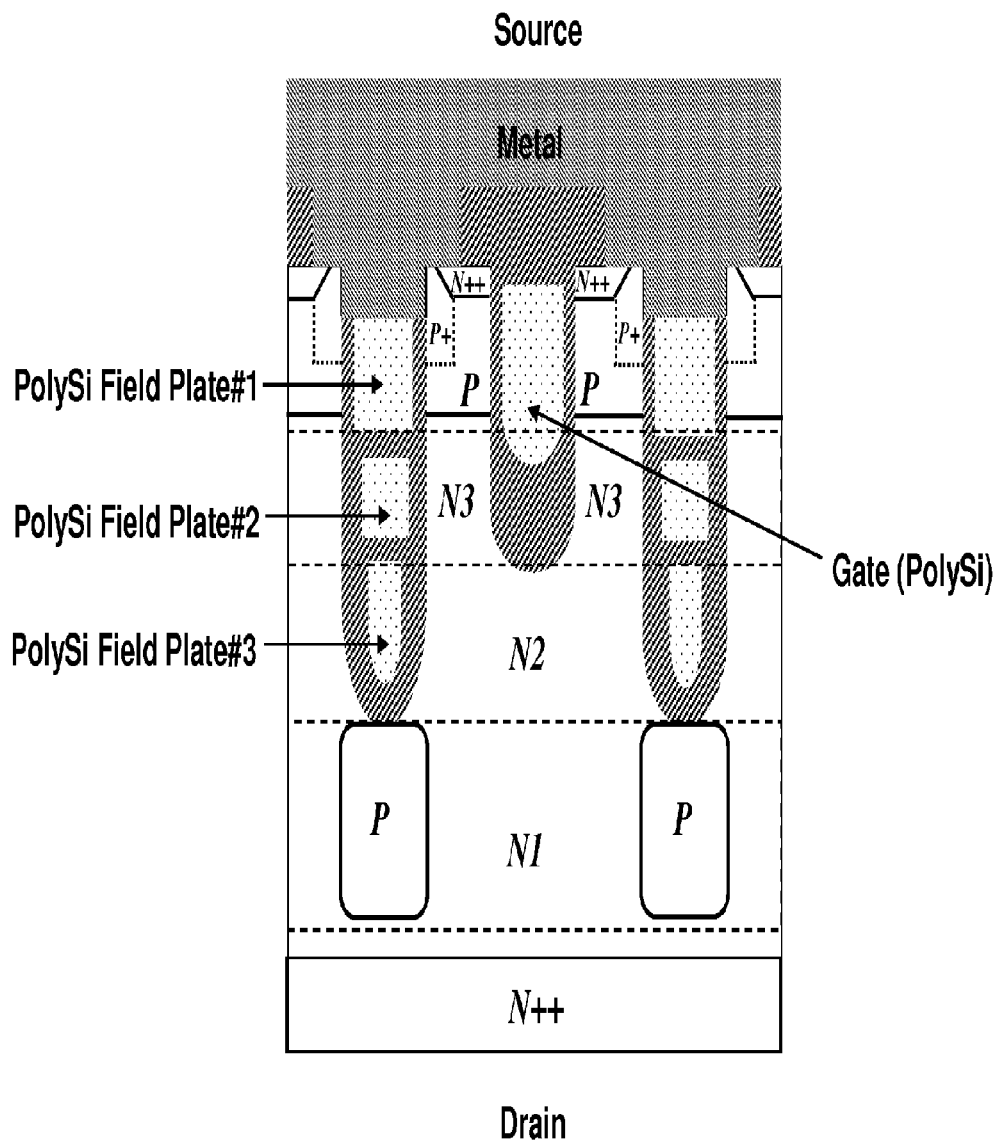
Figure 5F:
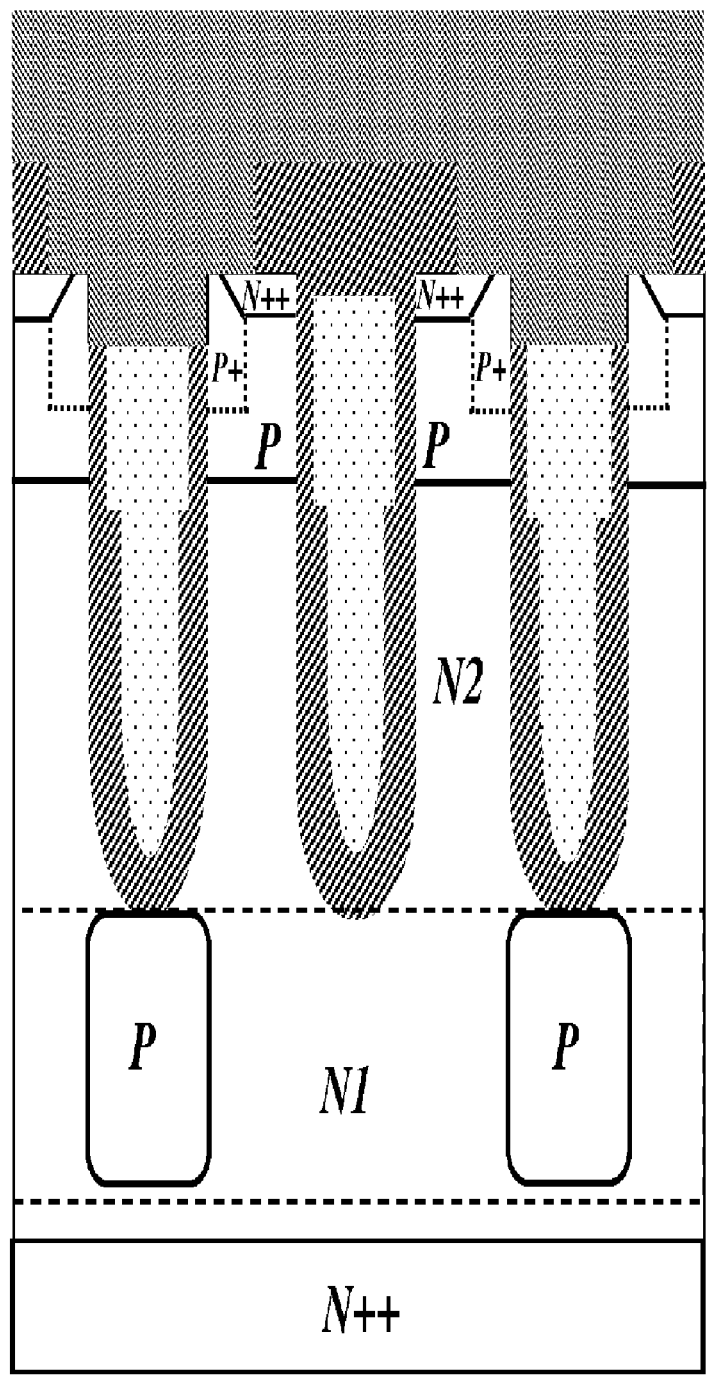

| DEVICE | RSP@10 V (mΩ·mm2) | BVDSS (V) | VTH (V) | CISS (pF/cm2) | COSS (pF/cm2) | Qg@10 V (nC/cm2) | Qgd (nC/cm2) | Ron*Qg (mΩ·nC) | Ron*Qgd (mΩ·nC) |
|---|---|---|---|---|---|---|---|---|---|
| Prior Art (FIG. 1) | 8.7 | 27.6 | 1.5 | 79245 | 18016 | 1004 | 196 | 87.4 | 17.0 |
| Prior Art (FIG. 2) | 9.8 | 42.5 | 1.5 | 98837 | 21869 | 1275 | 133 | 124.9 | 13.0 |
| Prior Art (FIG. 3) | 9.1 | 32.7 | 1.5 | 79908 | 11105 | 1038 | 140 | 94.5 | 12.8 |
| FIG. 5d | 10.2 | 51.9 | 1.5 | 80008 | 15056 | 1071 | 137 | 109.3 | 14.0 |
| FIG. 5d (with a lower EPI resistivity) | 7.2 | 42.3 | 1.5 | 80105 | 15773 | 1068 | 130 | 76.9 | 9.4 |

*All devices have the cell pitch of 1.2 um, the P-well junction depth of 0.55 um and GOX thickness of 50 nm.

What is claimed is:

1. A semiconductor active device structure, comprising:
   a source region having a first conductivity type, and a current-control structure which controls inversion of portions of a body region having a second conductivity type, to thereby control injection of majority carriers from said source region into a semiconductor drift region which has said first conductivity type;
   one or more field plates, comprising one or more electrically separated segments within a single insulated trench; wherein at least one of said segments is electrically floating; and
   an additional concentration of dopant atoms of said second conductivity type below the bottom of said trench;
   whereby said field plates smooth the gradation of potential in said drift region adjacent said trench, and said additional concentration of dopant atoms helps reduce depletion of said drift region under conditions of reverse bias.

2. The device structure of claim 1, wherein said current-control structure comprises a gate electrode which is capacitively coupled to a body region which has said second conductivity type.

3. The device structure of claim 1, wherein said additional concentration of dopant atoms is sufficient to create an isolated volume of second-conductivity-type material.

4. The device structure of claim 1, wherein said current-control structure comprises a gate electrode which is in a separate trench from said field plates.

5. The device structure of claim 1, wherein said additional concentration of dopants creates a near-intrinsic semiconductor region below said trench.

6. The device structure of claim 1, further comprising a drain region which has said first conductivity type and is more heavily doped than said drift region, and which underlies said drift region so that majority carriers can flow from said drift region downwardly into said drain region.

7. The device structure of claim 1, wherein different ones of said segments are laterally surrounded by different thicknesses of dielectric material.

8. A semiconductor active device structure, comprising:
   a current-control structure;
   a semiconductor drift region, through which carriers injected by said current control structure can pass in a predominantly vertical direction;
   a field-shaping structure, which adjoins at least part of said drift region, and which includes multiple separate conductive segments in a single insulated trench;
      wherein at least one of said segments is connected to a fixed potential, and at least one of said segments is electrically floating;
      and wherein different ones of said segments are laterally surrounded by different thicknesses of dielectric material; and
   an additional concentration of dopant atoms of said second conductivity type below the bottom of said trench;
   whereby said field plates smooth the gradation of potential in said drift region adjacent said trench, and said additional concentration of dopant atoms helps reduce depletion of said drift region under conditions of reverse bias.

9. The device structure of claim 8, wherein said current-control structure comprises a gate electrode which is capacitively coupled to a body region which has said second conductivity type.

10. The device structure of claim 8, wherein said additional concentration of dopant atoms is sufficient to create a volume of second-conductivity-type material.

11. The device structure of claim 8, wherein said current-control structure comprises a gate electrode which is in a separate trench from said field plates.

12. The device structure of claim 8, wherein said current-control structure comprises a gate electrode which is in a separate trench from said field plates.

13. The device structure of claim 8, further comprising a drain region which has said first conductivity type and is more heavily doped than said drift region, and which underlies said drift region so that majority carriers can flow from said drift region downwardly into said drain region.

14. The device structure of claim 8, wherein different ones of said segments are laterally surrounded by different thicknesses of dielectric material.

15. A semiconductor active device structure, comprising:
   a source region, and a current-control structure which controls injection of majority carriers from said source region into a semiconductor drift region which has said first conductivity type;
   a plurality of field plates, comprising multiple electrically separated electrodes within a single insulated trench; and
   an additional concentration of dopant atoms of said second conductivity type below the bottom of said trench;
   said drift region having different net doping concentrations at different depths, such that at least some ones of said field plates laterally adjoin portions of said drift region with different dopant concentrations;
   whereby said field plates smooth the gradation of potential in said drift region adjacent said trench, and said additional concentration of dopant atoms helps reduce depletion of said drift region under conditions of reverse bias.

16. The device structure of claim 15, wherein said current-control structure comprises a gate electrode which is capacitively coupled to a body region which has said second conductivity type.

17. The device structure of claim 15, wherein said first conductivity type is n-type.

18. The device structure of claim 15, wherein said additional concentration of dopant atoms consists of acceptor dopant atoms.

19. The device structure of claim 15, wherein said first conductivity type is n-type.

20. The device structure of claim 15, wherein said first conductivity type is n-type.

* * * * *